United States Patent
Park et al.

(10) Patent No.: US 11,437,541 B2
(45) Date of Patent: Sep. 6, 2022

(54) TRANSFER APPARATUS AND METHOD OF MANUFACTURING MICRO LED DISPLAY USING THE SAME

(71) Applicant: SAMSUNG ELECTRONICS CO., LTD., Suwon-si (KR)

(72) Inventors: Sangmoo Park, Suwon-si (KR); Doyoung Kwag, Suwon-si (KR); Byungchul Kim, Suwon-si (KR); Minsub Oh, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/870,242

(22) Filed: May 8, 2020

(65) Prior Publication Data

US 2020/0357951 A1  Nov. 12, 2020

(30) Foreign Application Priority Data

May 8, 2019  (KR) .................. 10-2019-0053592

(51) Int. Cl.
*H01L 33/00* (2010.01)
*G01R 31/26* (2020.01)
*H01L 25/075* (2006.01)

(52) U.S. Cl.
CPC ...... *H01L 33/0095* (2013.01); *G01R 31/2635* (2013.01); *H01L 25/0753* (2013.01)

(58) Field of Classification Search
CPC combination set(s) only.
See application file for complete search history.

(56) References Cited

U.S. PATENT DOCUMENTS

| 7,744,770 B2 | 6/2010 | Doi et al. |
| 10,236,447 B2 | 3/2019 | Danesh et al. |
| (Continued) | | |

FOREIGN PATENT DOCUMENTS

| JP | 2007-329266 A | 12/2007 |
| JP | 4600178 B2 | 12/2010 |
| (Continued) | | |

OTHER PUBLICATIONS

Communication dated Oct. 14, 2021, issued by the European Patent Office in European Application No. 20802565.0.
(Continued)

*Primary Examiner* — Ratisha Mehta
(74) *Attorney, Agent, or Firm* — Sughrue Mion, PLLC

(57) ABSTRACT

A method of manufacturing a micro light emitting diode (LED) display and a transfer apparatus are provided. The method of manufacturing a micro LED display includes: identifying a repairing micro LED, from among a plurality of second micro LEDs, on a second substrate based on a first position of a defective micro LED, from among a plurality of first micro LEDs, on a first substrate; removing the defective micro LED from the first substrate; matching the first position on the first substrate from which the defective micro LED has been removed to a second position of the repairing micro LED on the second substrate; and transferring the repairing micro LED from the second position on the second substrate to the first position on the first substrate from which the defective micro LED has been removed, by using a laser transfer method.

18 Claims, 22 Drawing Sheets

(56) References Cited

U.S. PATENT DOCUMENTS

| | | |
|---|---|---|
| 2007/0189451 A1 | 8/2007 | Lee et al. |
| 2013/0052902 A1 | 2/2013 | Jun et al. |
| 2017/0034921 A1 | 2/2017 | Pruefer |
| 2017/0215280 A1* | 7/2017 | Chaji .................. H01L 21/6835 |
| 2017/0263811 A1 | 9/2017 | Zou et al. |
| 2017/0346011 A1 | 11/2017 | Danesh et al. |
| 2018/0053751 A1 | 2/2018 | Zou et al. |
| 2018/0069148 A1* | 3/2018 | Zou ........................ H01L 33/62 |
| 2018/0342492 A1 | 11/2018 | Lu |
| 2019/0229149 A1* | 7/2019 | Yoo ........................ H01L 33/30 |
| 2019/0304854 A1* | 10/2019 | Ahn ...................... H01L 33/005 |
| 2020/0235076 A1* | 7/2020 | Batres ................. H01L 21/6835 |
| 2020/0388736 A1 | 12/2020 | Chen et al. |
| 2021/0404973 A1* | 12/2021 | Lee .................... G01N 21/9501 |

FOREIGN PATENT DOCUMENTS

| | | |
|---|---|---|
| JP | 4766258 B2 | 9/2011 |
| KR | 10-2007-0081282 A | 8/2007 |
| KR | 10-1423557 B1 | 8/2014 |
| KR | 10-1890934 B1 | 8/2018 |
| KR | 10-1918106 B1 | 11/2018 |
| KR | 10-2163570 B1 | 10/2020 |
| WO | 2020/197095 A1 | 10/2020 |

OTHER PUBLICATIONS

International Search Report (PCT/ISA/210) dated Sep. 14, 2020 by the International Searching Authority in International Application No. PCT/KR2020/005548.

Written Opinion (PCT/ISA/237) dated Sep. 14, 2020 by the International Searching Authority in International Application No. PCT/KR2020/005548.

Communication dated Jun. 10, 2022 by the European Patent Office in European Patent Application No. 20802565.0.

* cited by examiner

TRANSFER APPARATUS AND METHOD OF MANUFACTURING MICRO LED DISPLAY USING THE SAME

CROSS-REFERENCE TO RELATED APPLICATION(S)

This application is based on and claims priority under 35 U.S.C. § 119 to Korean Patent Application No. 10-2019-0053592, filed on May 8, 2019 in the Korean Intellectual Property Office, the disclosure of which is incorporated by reference herein in its entirety.

BACKGROUND

1. Field

The disclosure relates to a transfer apparatus that enables improvement of efficiency in manufacturing a micro light emitting diode (LED), and a method of manufacturing a micro LED display using the same.

2. Description of Related Art

The micro-luminescent diode (Micro LED, MLED or µLED) display panel is a flat display and consists of a plurality of inorganic light-emitting diodes, each being less than 100 micrometers.

A micro LED display panel provides a higher contrast resolution, a lower response time and higher energy efficiency compared to a liquid crystal panel (LCD) that requires backlight.

While both organic LEDs (OLED) and micro LEDs have better energy efficiency, micro LEDs tend to be brighter and have longer lifespan than OLEDs. Also, micro LEDs tend to have greater luminous efficiency than OLEDs.

A micro LED is a self-luminous micro inorganic light emitting device and may have width, length, and height of about 10 to 100 µm. The micro LED may be manufactured in a form of a chip on a wafer, and may be arranged on a target substrate to constitute a light emitting module of a display.

A display device using the micro LED may be manufactured by mounting millions of micro LEDs at small intervals.

However, some of the micro LEDs on the target substrate may be impaired due to manufacturing process intolerance and defects in the micro LEDs themselves.

A repair process for removing a defective micro LED and mounting a new micro LED at a position from which the defective micro LED is removed may be time-consuming. Therefore, it is desirable to improve efficiency in the repair process.

SUMMARY

In accordance with an aspect of the disclosure, there is provided method of manufacturing a micro light emitting diode (LED) display, the method including: identifying a repairing micro LED, from among a plurality of second micro LEDs, on a second substrate based on a first position of a defective micro LED, from among a plurality of first micro LEDs, on a first substrate; removing the defective micro LED from the first substrate; matching the first position on the first substrate from which the defective micro LED has been removed to a second position of the repairing micro LED on the second substrate; and transferring the repairing micro LED from the second position on the second substrate to the first position on the first substrate from which the defective micro LED has been removed, by using a laser transfer method.

The identifying the repairing micro LED may include selecting a plurality of repairing micro LEDs, from among the plurality of second micro LEDs, on the second substrate based on a distance between a plurality of defective micro LEDs on the first substrate.

The selecting the repairing micro LED may further include identifying a second micro LED that is closest to the defective micro LED, from among the plurality of second micro LEDs, as the repairing micro LED.

The identifying the repairing micro LED may further include identifying the second micro LED that is closest to the defective micro LED, from among second micro LEDs having characteristic information corresponding to the defective micro LED, as the repairing micro LED.

The transferring may include sequentially scanning an upper surface of the second substrate on which the plurality of repairing micro LEDs are arranged to sequentially transfer the plurality of repairing micro LEDs to the first substrate.

The first substrate may be a target substrate mounted on the micro LED display, the second substrate may be a transfer substrate for transferring a micro LED to the target substrate, and the matching may include moving the second substrate with respect to the first substrate.

The matching may further include moving at least one of the first substrate or the second substrate to align the second position on the second substrate with the first position on the first substrate.

The method may further include identifying the defective micro LED, from among the plurality of first micro LEDs, on the first substrate; and storing information on the first position of the defective micro LED on the first substrate.

The characteristic information may be at least one of an output wavelength, a luminance, or a performance grade.

The plurality of first micro LEDs include a red micro LED, a green micro LED, and a blue micro LED, and a color of light emitted by the repairing micro LED corresponds to a color of light emitted by the defective micro LED.

In accordance with an aspect of the disclosure, there is provided a transfer apparatus including: a laser device; a moving member configured to move at least one of a first substrate on which a plurality of first micro light emitting diodes (LEDs) are arranged or a second substrate on which a plurality of second micro LEDs are arranged; an extraction member configured to remove a micro LED; and a processor configured to: identify a repairing micro LED, from among the plurality of second micro LEDs, based on a first position of a defective micro LED, from among the plurality of first micro LEDs, on the first substrate, control the extraction member to remove the defective micro LED from the first substrate, control the moving member to match the first position on the first substrate from which the defective micro LED has been removed to a second position of the repairing micro LED on the second substrate, and control the laser device to transfer the repairing micro LED from the second position on the second substrate to the first position on the first substrate from which the defective micro LED has been removed.

The processor may be further configured to identify a plurality of repairing micro LEDs, from among the plurality of second micro LEDs, on the second substrate based on a distance between a plurality of defective micro LEDs on the first substrate.

The processor may be further configured to identify a second micro LED that is closest to the defective micro LED, from among the plurality of second micro LEDs, as the repairing micro LED.

The processor may be further configured to identify the second micro LED that is closest to the defective micro LED, from among second micro LEDs having characteristic information corresponding to the defective micro LED, as the repairing micro LED.

The processor may be further configured to control the laser device to sequentially scan an upper surface of the second substrate on which the plurality of repairing micro LEDs are arranged, with a laser to sequentially transfer the plurality of repairing micro LEDs to the first substrate.

The first substrate may be a target substrate mounted on the micro LED display, the second substrate may be a transfer substrate for transferring a micro LED to the target substrate, and the processor may be further configured to control the moving member to move the second substrate with respect to the first substrate.

The processor may be further configured to control the moving member to move at least one of the first substrate or the second substrate to align the second position on the second substrate with the first position on the first substrate.

The characteristic information may be at least one of an output wavelength, a luminance, or a performance grade.

The plurality of first micro LEDs include a red micro LED, a green micro LED, and a blue micro LED, and a color of light emitted by the repairing micro LED corresponds to a color of light emitted by the defective micro LED.

In accordance with an aspect of the disclosure, there is provided a non-transitory computer readable recording medium storing a program including executable instructions, which when executed by a processor, cause the processor to perform a method of manufacturing a micro light emitting diode (LED) display, the method including: identifying a repairing micro LED, from among a plurality of second micro LEDs, on a second substrate based on a first position of a defective micro LED, from among a plurality of first micro LEDs, on a first substrate; removing the defective micro LED from the first substrate; matching the first position on the first substrate from which the defective micro LED has been removed to a second position of the repairing micro LED on the second substrate; and transferring the repairing micro LED from the second position on the second substrate to the first position on the first substrate from which the defective micro LED has been removed, by using a laser transfer method.

BRIEF DESCRIPTION OF THE DRAWINGS

The above and other aspects, features, and advantages of certain embodiments of the disclosure will be more apparent from the following description, taken in conjunction with the accompanying drawings, in which.

DETAILED DESCRIPTION

Figure 1:
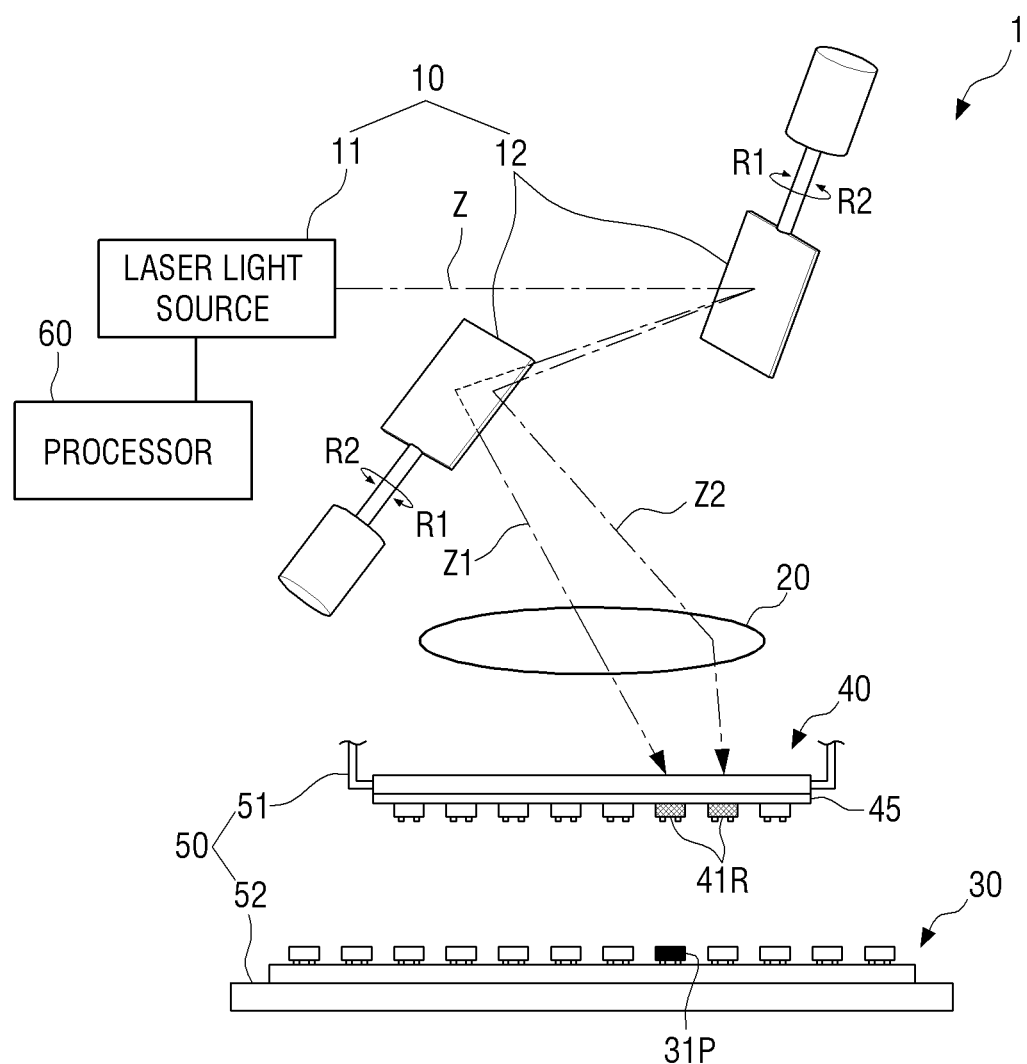
FIG. 1 is a schematic diagram illustrating a transfer apparatus according to an embodiment.

Embodiments of the disclosure will be described with reference to the accompanying drawings. The embodiments of the disclosure may be modified to take many different forms and should not be construed as limited to the embodiments set forth herein. It should be understood that the disclosure is provided to enable a person having ordinary skill in the art to understand the embodiments of the disclosure, and the disclosure is not limited to a specific embodiments. In the accompanying drawings, the constituent elements are enlarged in size for convenience of explanation and the proportion of each constituent element may be exaggerated or reduced.

It may be understood that when a constituent element is referred to as being "on" or connected to" another element, it may be directly connected or directly coupled to another constituent element, or an intervening constituent element may be present therebetween. In contrast, when a constituent element is referred to as being "directly on" or "directly connected to" another constituent element, there is no intervening constituent element is present therebetween. For example, other expressions describing relationships between constituent elements, such as "between A and B" and "directly between A and B" may be construed in a similar manner, however, it is not limited thereto.

Terms such as "first" and "second" may be used to describe various constituent elements, but the constituent elements are not to be construed as being limited to the terms. The terms may be only used to differentiate one constituent element from another constituent element. For example, the "first" component may be named the "second" component without departing from the scope of the disclosure and the "second" component may also be similarly named the "first" component.

Singular forms may include plural forms unless the context clearly indicates otherwise. Terms "include" or "have" may be used to specify the presence of stated features, numerals, steps, operations, components, parts, or a combination thereof, and it may be construed that addition of one or more other features, numerals, steps, operations, components, parts, or a combination thereof is possible.

Unless otherwise defined, all terms used in the disclosure may have the same meaning as commonly understood by a person having ordinary skills in the art to which the disclosure pertains.

A display module may be applied to a wearable device, a portable device, a handheld device as a single unit and to electronic products that require various displays. In addition, the display module 10 may be a matrix type applicable to a display device such as a personal computer monitor, a high-resolution TV, a signage, and an electronic display through a plurality of assembly arrangements.

The disclosure relates to a transfer apparatus that improves efficiency in repairing a defective micro light emitting diode (LED), and a method of manufacturing a micro LED display using the same.

Hereinafter, a structure of a transfer apparatus 1 according to an embodiment will be described with reference to FIGS. 1, 2 and 3.

FIG. 1 is a schematic diagram illustrating the transfer apparatus 1 according to an embodiment; FIG. 2 is a block diagram illustrating a processor 60 and a memory 70 according to an embodiment; FIG. 3A is a bottom view illustrating a second substrate 40 according to an embodiment; and FIG. 3B is a top view illustrating a display module 30 according to an embodiment.

The transfer apparatus 1 is an apparatus for repairing a first substrate 30 on which a plurality of micro light emitting diodes (LEDs) are arranged. The transfer apparatus 1 may include a laser device 10, the first substrate 30 on which a plurality of first micro LEDs 31 are arranged, a moving member 50 which moves the second substrate 40 on which a plurality of second micro LEDs 41 are arranged, an extraction member 80 (see FIG. 4A) that removes a defective micro LED 31P from the first substrate 30, and a processor 60 that controls the moving member 50 and the laser device 10.

The laser device 10 may be a device that applies a laser to the plurality of second micro LEDs 41 arranged on the second substrate 40 to transfer the plurality of second micro LEDs 41.

The laser device 10 may include a laser light source 11 which may provide a laser, and path change members 12 which change a path of a laser Z emitted from the laser light source 11.

The laser light source 11 may lift-off a repairing micro LED 41R from the second substrate 40 by applying a laser to a position at which the repairing micro LED 41R to be transferred is arranged.

Specifically, the laser light source 11 applies a laser Z, in a specific wavelength range, to an upper portion of the second substrate 40 on which the repairing micro LED 41R is arranged. As a result, adhesiveness of a reactive layer 45 that reacts with the laser Z in the specific wavelength range may be reduced, and the repairing micro LED 41R may be separated from the second substrate 40.

The laser light source 11 may be disposed at various positions in the transfer apparatus 1.

The path change members 12 may rapidly change the path of the laser Z emitted from the laser light source 11, which is a point light source, to render the laser Z in a similar form to those of a surface light source and a linear light source.

Specifically, the path change members 12 may change the path of the laser Z emitted from one laser light source 11 in a unit of ms, micro sec (µs), or nano sec (ns) to irradiate positions corresponding to a plurality of repairing micro LEDs 41R to be separated from the second substrate 40 with one laser Z.

Therefore, the plurality of repairing micro LEDs 41R irradiated with the laser Z of which the path is rapidly changed by the path change members 12 may be sequentially separated from the second substrate 40.

Here, a time interval at which the plurality of repairing micro LEDs 41R are separated is ms, µs, or ns, and thus the plurality of repairing micro LEDs 41R may be rapidly separated from the second substrate 40.

That is, the path change members 12 may rapidly change the path of the laser Z emitted from one laser light source 11 to almost simultaneously transfer the plurality of repairing micro LEDs 41R to the first substrate 30.

For example, the path change members 12 may include galvano mirrors. The galvano mirror is a device capable of rapidly changing a path of light from a light source by rapidly rotating a mirror that reflects the light from the light source.

Specifically, referring to FIG. 1, the path change members 12 may move in a predetermined rotation direction R1 or R2 to change the path of the laser Z toward positions of the plurality of repairing micro LEDs 41R to be transferred based on information of the positions of the plurality of repairing micro LEDs 41R to be transferred, the information being stored in a memory 70 by the processor 60.

For example, the laser Z may be sequentially reflected by the galvano mirrors to implement a first laser path and a second laser path so that the laser Z may be incident upon the positions at which the plurality of repairing micro LEDs 41R are arranged, respectively.

A lens member 20 may be disposed between the path change members 12 and the second substrate 40 and selectively change a focal length of the laser Z and the path of the laser Z. For example, the lens member 20 may be a f-theta (f-O) lens.

As a result, the laser Z is sequentially reflected by the galvano mirrors, such that the path of the laser Z may be changed.

Referring to FIG. 3A, the second substrate 40 may include a plurality of second micro LEDs 41 to be selectively transferred to the first substrate 30.

Here, electrodes of the plurality of second micro LEDs 41 are not illustrated for convenience of explanation.

The second substrate 40 may be a target substrate or a transfer substrate for transferring a micro LED. For example, the second substrate 40 may be a wafer. However, the second substrate 40 may be a relay substrate, as needed.

The plurality of second micro LEDs 41 may be arranged on the second substrate 40, spaced apart from each other at a first interval L1, and formed in a single color.

For example, the plurality of second micro LEDs 41 may be one of red micro LEDs which emit red light, green micro LEDs which emit green light, or blue micro LEDs which emit blue light.

Further, the plurality of second micro LEDs 41 may be transferred to positions where defective micro LEDs 31P of the first substrate 30 are arranged.

Here, among the plurality of second micro LEDs 41, second micro LEDs that are transferred to the positions where the defective micro LEDs 31P are arranged may be referred to as repairing micro LEDs 41R. Further, the repairing micro LEDs 41R may mean micro LEDs that are determined, by the processor 60, to be transferred among the plurality of second micro LEDs 41.

Further, the second substrate 40 may be connected by a substrate moving member 51. The substrate moving member 51 may rotate the second substrate 40 in a U1 direction or U2 direction with respect to a first central axis O1.

Referring to FIGS. 1 and 3B, the first substrate 30 may include first to fourth display modules 30-1, 30-2, 30-3, and 30-4. Here, each of the first to fourth display modules 30-1, 30-2, 30-3, and 30-4 may be the first substrate 30.

That is, in case that the processor 60 performs a repair process, each of the first to fourth display modules 30-1, 30-2, 30-3, and 30-4 may be treated as the first substrate 30.

The first substrate 30 is a micro LED display, and a display screen may be implemented by a plurality of first micro LEDs 31 arranged on the first substrate 30.

The first substrate 30 is a base unit of a display capable of implementing the display screen, and may implement the display screen in various electronic products such as a television (TV), a cellular phone, a personal computer (PC), a notebook PC, and a personal digital assistant (PDA).

Further, the first substrate 30 may be a target substrate mounted on the micro LED display.

The first substrate 30 may include the plurality of first micro LEDs 31 arranged thereon. The plurality of first micro LEDs 31 may be arranged at a constant interval, that is, at a second interval L2. Here, the first interval L1 between the plurality of second micro LEDs 41 may be substantially equal to the second interval L2 between the plurality of first micro LEDs 31.

Therefore, in case that a plurality of defective micro LEDs 31P are arranged at the second interval L2, the first substrate 30 and the second substrate 40 may not be moved by transferring a plurality of repairing micro LEDs 41R arranged at the first interval L1 among the plurality of second micro LEDs 41.

That is, in case that the first interval L1 and the second interval L2 are equal, the first substrate 30 and the second substrate 40 may not need to be moved to adjust the first interval L1 and the second interval L2, such that a transferring speed and a repair speed may be increased.

Further, the plurality of first micro LEDs 31 may include a red micro LED 31-1 which emits red light, a green micro LED 31-2 which emits green light, or a blue micro LED 31-3 which emits blue light.

The red micro LED 31-1, the green micro LED 31-2, and the blue micro LED 31-3 may be arranged at the same interval and collectively constitute one pixel P.

That is, the red micro LED 31-1, the green micro LED 31-2, and the blue micro LED 31-3 may each be referred to as a sub-pixel constituting one pixel P.

Further, the red micro LED 31-1 may be arranged in a first row of the first substrate 30, the green micro LED 31-2 may be arranged in a second row of the first substrate 30, and the blue micro LED 31-3 may be arranged in a third row of the first substrate 30.

However, the red micro LED 31-1, the green micro LED 31-2, and the blue micro LED 31-3 configuring one pixel P may be variously arranged, instead of being arranged in parallel.

Further, the transfer apparatus 1 may include an inspection member for identifying the defective micro LED 31P.

For example, the inspection member may identify the defective micro LED 31P among the plurality of first micro LEDs 31 arranged on the first substrate 30 including the first to fourth display modules 30-1, 30-2, 30-3, and 30-4.

Specifically, the inspection member may identify characteristic information of each of the plurality of first micro LEDs 31 by performing various types of inspection including a vision inspection on the plurality of first micro LEDs 31 arranged on the first substrate 30.

Here, the characteristic information may be a value obtained by measuring an output wavelength or a luminance of each of the plurality of micro LEDs, or at least one of an input/output wavelength, an input luminance, or an input performance grade.

The processor 60 may obtain the identified characteristic information of each of the plurality of first micro LEDs 31, information on a defective micro LED 31P identified by comparison with a predetermined reference characteristic, and an arrangement position of the defective micro LED 31P.

Here, the arrangement position may include a coordinate value of the defective micro LED 31P arranged on the first substrate 30.

That is, the processor 60 may store information on a position of the defective micro LED 31P of the first substrate 30 in the memory 70.

Accordingly, the inspection member may identify that one first defective micro LED 31P-1 is present on the first display module 30-1, a plurality of second defective micro LEDs 31P-2 are present on the second display module 30-2, a plurality of third defective micro LEDs 31P-3 are present on the third display module 30-3, and a plurality of fourth defective micro LEDs 31P-4 are present on the fourth display module 30-4, as illustrated in FIG. 3B.

However, the transfer apparatus 1 may not necessarily include the inspection member. Instead, the defective micro LED 31P may be identified by an inspection device provided separately from the transfer apparatus 1, and an arrangement position and characteristic information of the identified defective micro LED 31P may also be identified by receiving the arrangement position and the characteristic information of the identified defective micro LED 31P from the inspection device and storing the arrangement position and the characteristic information in the memory 70.

Further, the inspection member may be a vision inspection system or an automated optical inspection (AOI) system.

The moving member 50 may include the substrate moving member 51 which moves and rotates the second substrate 40, and a stage 52 which moves and rotates the first substrate 30.

The moving member 50 may move and rotate the first substrate 30 and the second substrate 40 to arrange the repairing micro LED 41R on the second substrate 40 at a position from which the defective micro LED 31P on the first substrate 30 is removed.

The processor 60 may control the movement of the moving member 50, and the moving member 50 may have various configurations as long as the moving member 50 may move and rotate the first substrate 30 and the second substrate 40.

Figure 2:
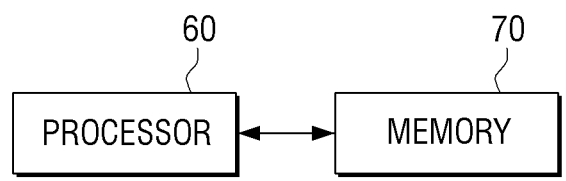
FIG. 2 is a block diagram illustrating a processor and a memory according to an embodiment.
Figure 3A:
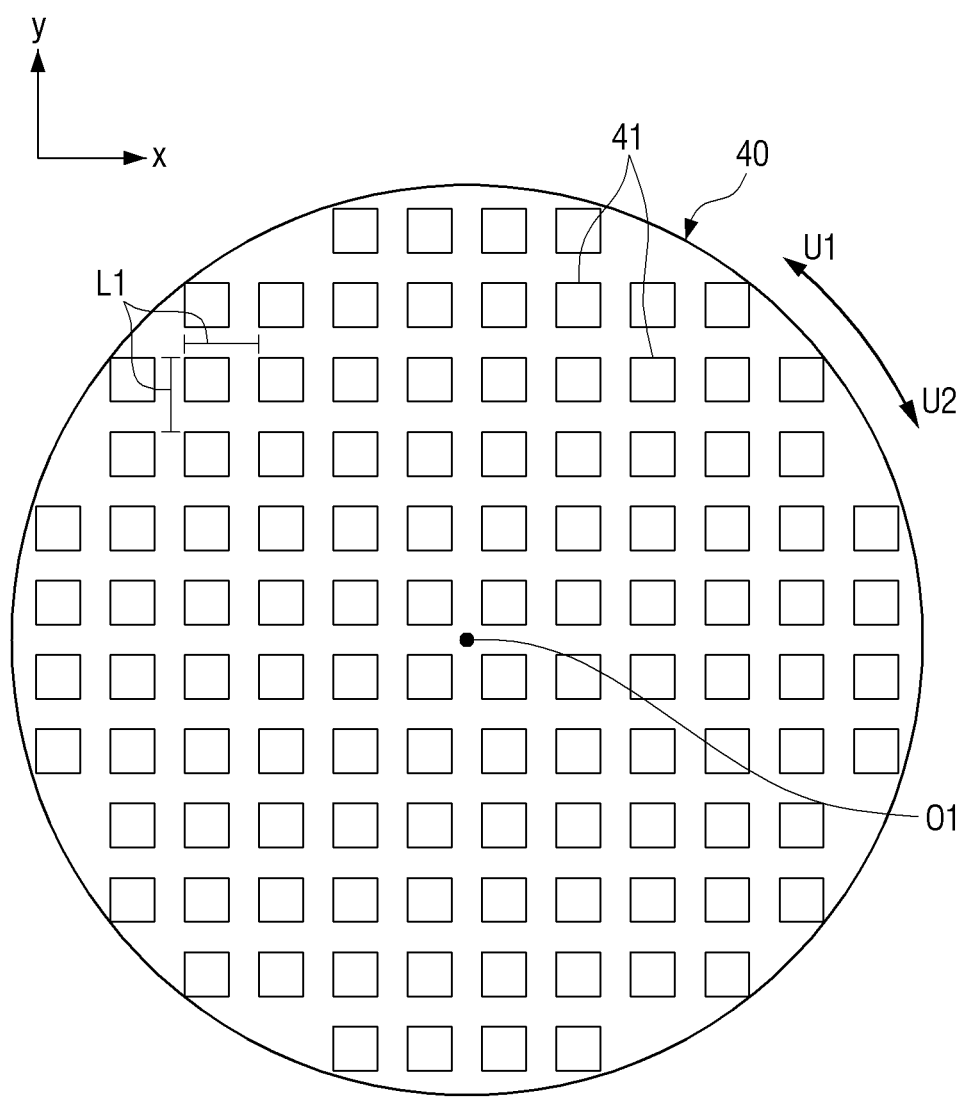
FIG. 3A is a bottom view illustrating a second substrate according to an embodiment.
Figure 3B:
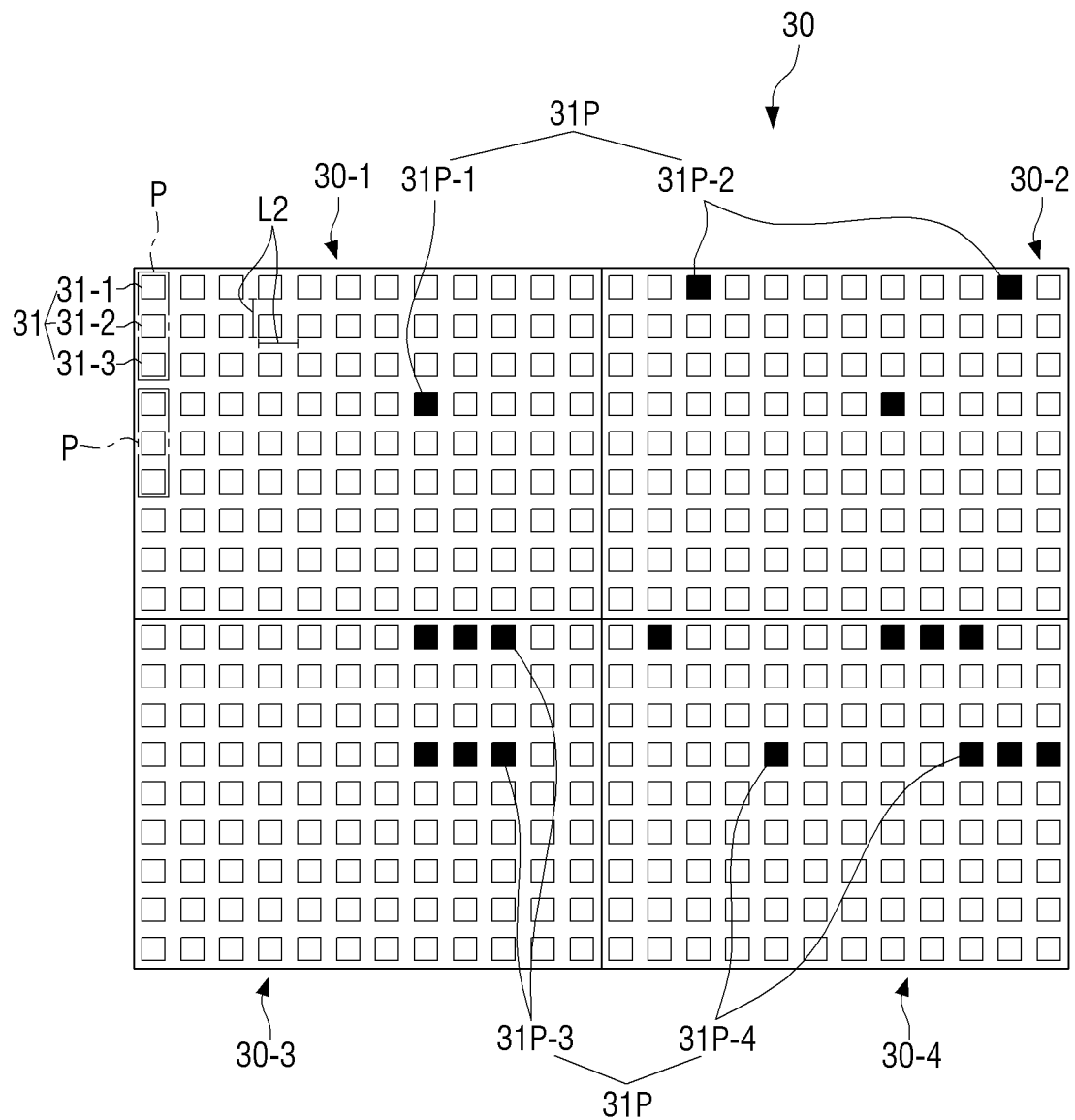
FIG. 3B is a top view illustrating a display module according to an embodiment.

As illustrated in FIGS. 1 and 2, the processor 60 may be integrated into the transfer apparatus 1, and may control an overall operation of the transfer apparatus 1.

For example, the processor 60 may implement a method of manufacturing a micro LED display to be described later, through the transfer apparatus 1.

That is, the processor 60 may be electrically connected to the laser device 10 and the moving member 50 to control each component.

However, all the components may not be necessarily controlled by a single processor. The respective components may also be controlled by using multiple independent processors.

Here, the processor 60 may include one or more of a central processing unit (CPU), a controller, an application processor (AP), a communication processor (CP), and an ARM processor.

Further, the processor 60 may be electrically connected to the memory 70 to use first characteristic information of the plurality of first micro LEDs 31 and second characteristic information of the plurality of second micro LEDs 41 stored in the memory 70. Specific functions of the processor 60 according to an embodiment of the disclosure will be described later.

As illustrated in FIG. 2, the memory 70 may be integrated into the transfer apparatus 1. Further, the memory 70 may be implemented by at least one of a flash memory, a read only memory (ROM), a hard disk type memory, a multimedia card micro type memory, or a card type memory (for example, an SD memory or XD memory).

The memory 70 may be electrically connected to the processor 60 to transmit and receive a signal and information to and from the processor 60. The memory 70 may store the first characteristic information of the plurality of first micro LEDs 31 and second characteristic information of the plurality of second micro LEDs 41 that are input or obtained by inspection, and transmit the stored characteristic information to the processor 60.

Hereinafter, a micro LED repairing process according to an embodiment of the disclosure will be described with reference to FIGS. 4A and 4B.

Figure 4A:
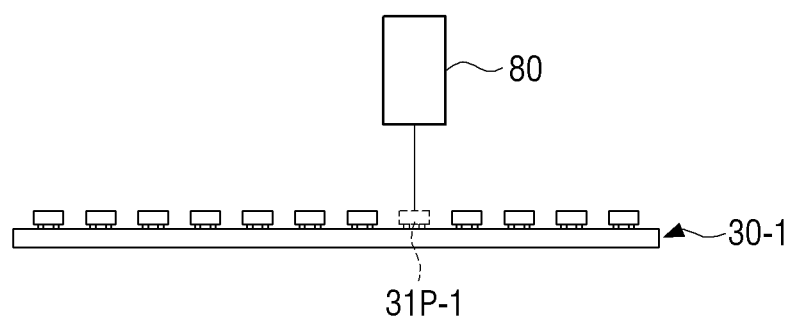
FIG. 4A is a schematic diagram illustrating a process of removing a first defective micro light emitting diode (LED) from a first display module according to an embodiment.
Figure 4B:
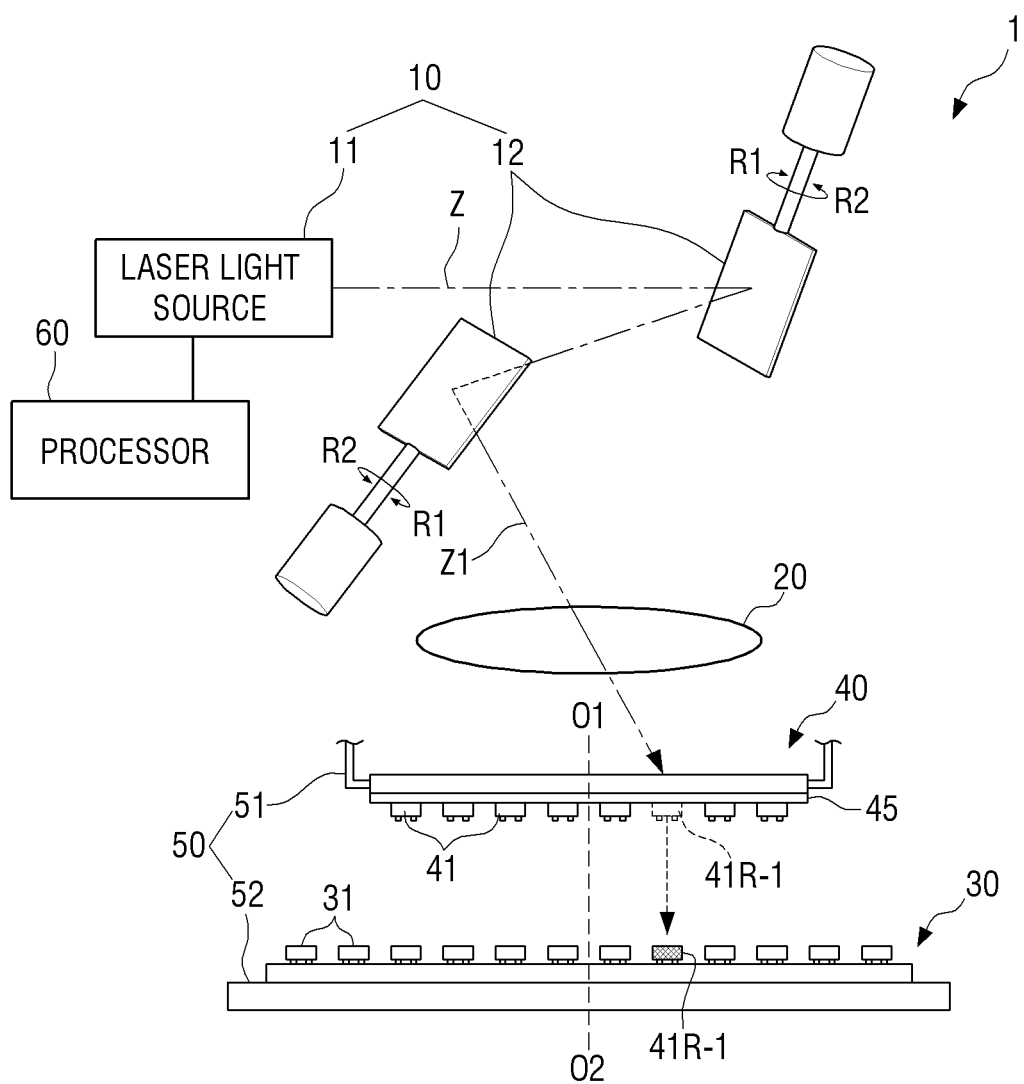
FIG. 4B is a schematic diagram illustrating a process of transferring a first repairing micro LED according to an embodiment.

FIG. 4A is a schematic diagram illustrating a process of removing the first defective micro LED 31P-1 from the first display module 30-1 according to an embodiment, and FIG. 4B is a schematic diagram illustrating a process of transferring a first repairing micro LED 41R-1 according to an embodiment.

As illustrated in FIG. 3B, the arrangement position of the defective micro LED 31P of the first substrate 30 may be identified through the inspection member.

Hereinafter, a method of repairing a micro LED display with the first defective micro LED 31P-1 arranged on the first display module 30-1 will be described in detail.

First, the processor 60 may identify an arrangement position of a first defective micro LED 31P-1 through the inspection member.

Then, the processor 60 may transmit information on the identified arrangement position to the memory 70 and select a repairing micro LED 41R to replace the defective micro LED 31P.

Here, a color of light emitted from the repairing micro LED 41R may correspond to a color of light emitted by the defective micro LED 31P.

That is, the processor 60 may select the repairing micro LED 41R to replace the defective micro LED 31P, among the plurality of second micro LEDs 41 arranged on the second substrate 40, in consideration of the arrangement position of the defective micro LED 31P on the first substrate 30 on which the plurality of first micro LEDs 31 are arranged.

Similarly, the processor 60 may select the repairing micro LED 41R among the plurality of second micro LEDs 41 on the second substrate 40 in consideration of the position of the defective micro LED 31P among the plurality of first micro LEDs 31 on the first substrate 30.

Here, in selecting the repairing micro LED 41R by the processor 60, the processor 60 may select, as the first repairing micro LED 41R-1, a micro LED that is arranged to face the arrangement position of the first defective micro LED 31P-1, based on the second substrate 40 and the first display module 30-1 being aligned to each other by the central axis O1 of the second substrate 40 and a central axis O2 of the first display module 30-1. In other words, the processor 60 may select the first repairing micro LED 41R-1, among the plurality of micro LEDs arranged on the second substrate 40, that is positioned such that it aligns with the first defective micro LED 31P-1 on the first display module 30-1.

Further, in case that there is no micro LED arranged to face the first defective micro LED 31P-1, the processor 60 may select, as the first repairing micro LED 41R-1, one micro LED that is arranged adjacent to the first defective micro LED 31P-1 among the plurality of second micro LEDs 41.

For example, the processor 60 may select, as the first repairing micro LED 41R-1, one micro LED that is closest to the first defective micro LED 31P-1 among the plurality of second micro LEDs 41.

That is, the processor 60 may select the first repairing micro LED 41R-1 having the shortest distance to the first defective micro LED 31P-1. Specifically, the processor 60 may determine a plurality of distances between a coordinate value of the first defective micro LED 31P-1 and coordinate values of the plurality of second micro LEDs 41, and select the shortest distance among the plurality of distances.

Then, as illustrated in FIG. 4A, an extraction member 80 may remove the identified first defective micro LED 31P-1. Here, the extraction member 80 may be included in the transfer apparatus 1 and may remove the defective micro LED 31P using various methods.

The extraction member 80 may be provided in the transfer apparatus 1 or may be provided as an external device separate from the transfer apparatus 1. That is, the defective micro LED 31P may be removed in the transfer apparatus 1 or the first substrate 30 in a state in which the defective micro LED 31P is removed may be provided to the transfer apparatus 1.

Then, the processor 60 may control the moving member 50 to move and rotate at least one of the first substrate 30 or the second substrate 40 to make the first defective micro LED 31P-1 and the first repairing micro LED 41R-1 to be aligned with each other.

That is, the processor 60 may control the moving member 50 to arrange the repairing micro LED 41R on the first substrate 30 to correspond to an arrangement position of the defective micro LED 31P.

Similarly, the processor 60 may control the moving member 50 to match the second substrate 40 and the first substrate 30 to make a position of the repairing micro LED 41R correspond to a position at which the defective micro LED 31P is removed.

Furthermore, referring to FIG. 4B, the processor 60 may control the laser device 10 to transfer the first repairing micro LED 41R-1 to the position at which the first defective micro LED 31P-1 is removed.

That is, the processor 60 may control the laser device 10 to transfer the repairing micro LED 41R to a position corresponding to the defective micro LED 31P by a laser transfer method.

Similarly, the repairing micro LED 41R may be transferred to a position from which the defective micro LED 31P of the first substrate 30 is removed by the laser transfer method, to replace the defective micro LED 31P with the repairing micro LED 41R.

Here, the processor 60 may control the moving member 50 to move the second substrate 40 to above the first substrate 30.

Hereinafter, a method of manufacturing a micro LED display with a first defective micro LED 31P-1 arranged on a first display module 30-1 according to a modified embodiment will be described in detail.

Figure 5A:
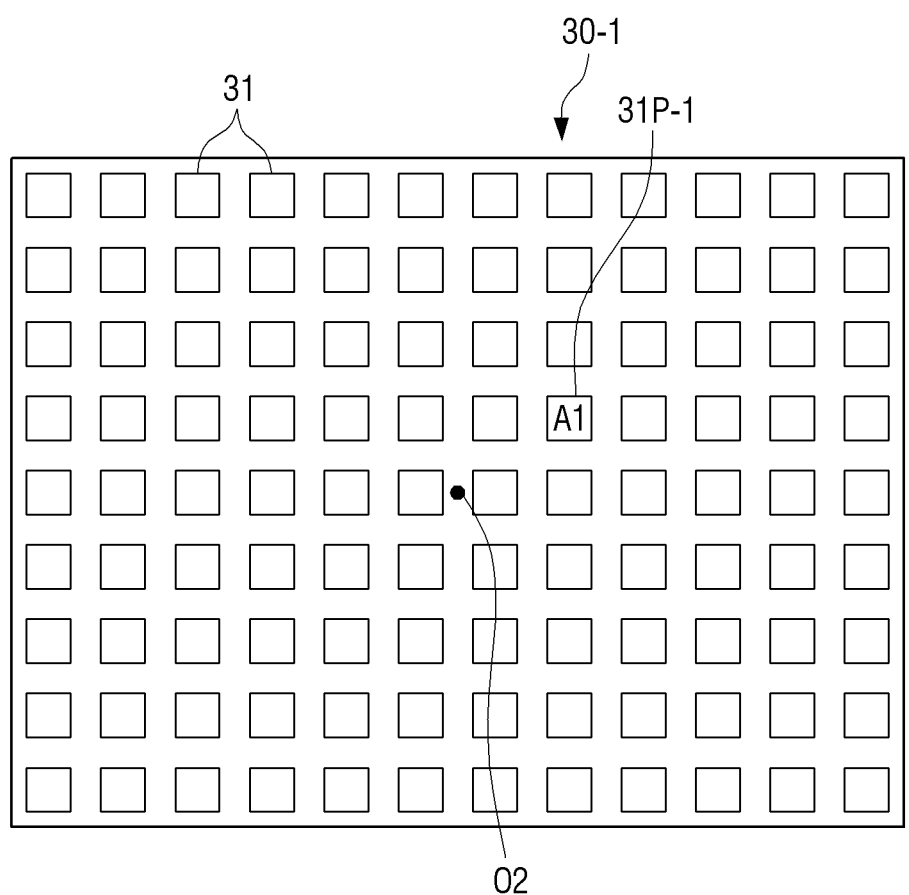
FIG. 5A is a top view illustrating a first display module according to an embodiment.
Figure 5B:
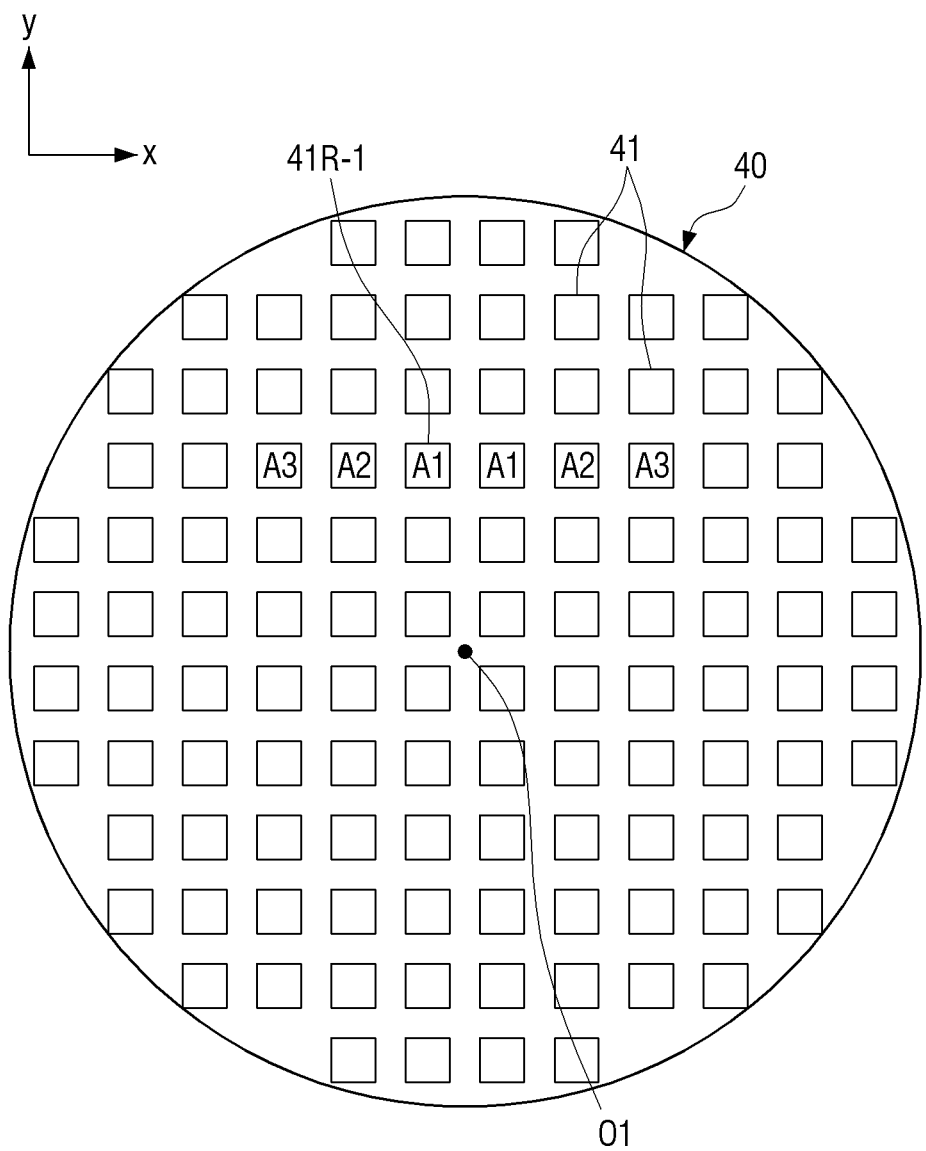
FIG. 5B is a bottom view illustrating a second substrate according to an embodiment.

FIG. 5A is a top view illustrating the first display module 30-1 according to the modified embodiment, and FIG. 5B is a bottom view illustrating a second substrate 40 according to the modified embodiment.

Here, the modified embodiment and the above-described embodiment may be different with respect to a process of selecting a repairing micro LED 41R, but may be the same in terms of the structure. Therefore, the same components will be denoted by the same reference numerals, and an overlapping description thereof will be omitted.

First, the processor 60 may obtain characteristic information of an identified first defective micro LED 31P-1 of the first display module 30-1. For example, the processor 60 may obtain the characteristic information of the first defective micro LED 31P-1 in consideration of an arrangement position of a defective micro LED 31P based on characteristic information of a plurality of first micro LEDs 31 stored in the memory 70.

Based on the obtained characteristic information, the processor 60 may select a first repairing micro LED 41R-1 having characteristic information corresponding to the characteristic information of the first defective micro LED 31P-1 among a plurality of second micro LEDs 41 of the second substrate 40.

For example, referring to FIGS. 5A and 5B, the first defective micro LED 31P-1 has a grade of A1, and thus the processor 60 may select the first repairing micro LED 41R-1 having the same grade of A1, among the plurality of second micro LEDs 41.

Here, the grade of A1 may mean a performance grade of the micro LED. For example, the performance grade may refer to a level of an output wavelength or luminance based on a specific criterion, and the specific criterion may vary depending on the need of the user.

For example, in case that the performance grade is based on the output wavelength, a higher performance grade may mean a wavelength closer to a specific reference wavelength range, and a lower performance grade may mean a wavelength farther away from the specific reference wavelength range.

Further, in case that the performance grade is based on the luminance, a higher performance grade may mean a higher luminance, and a lower performance grade may mean a lower luminance.

In addition, the performance grade may also be based on both of the output wavelength and the luminance according to an arbitrary criterion set by the user. For example, the performance grade may be set by giving U/100 weight (here, U is a natural number equal to or less than 100) to the output wavelength and giving (100-U)/100 weight to the luminance depending on a characteristic desired to be implemented by the user.

That is, the processor 60 may select a repairing micro LED 41R corresponding to the characteristic information of the defective micro LED 31P, among the plurality of second micro LEDs 41, based on the characteristic information of the defective micro LED 31P.

Therefore, even in case that the first defective micro LED 31P-1 is replaced through the repair process, the first defective micro LED 31P-1 is replaced with the first repairing micro LED 41R-1 having the same characteristic information, and thus it is possible to significantly reduce the difference in luminance and color of the display module before and after the repair process.

Further, the processor 60 may select the first repairing micro LED 41R-1 based on a distance between the first defective micro LED 31P-1 and the first repairing micro LED 41R-1, in addition to the consideration of characteristic information.

For example, when it is identified that there are a plurality of micro LEDs having the grade of A in the plurality of second micro LEDs 41 as illustrated in FIG. 5B, the processor 60 may select, as the repairing micro LED 41R, a micro LED that is closest to the defective micro LED 31P among the plurality of micro LEDs having the grade of A1.

Accordingly, it is possible to significantly reduce the difference in luminance and color of the display module before and after the repair process, while improving the speed of the repair process.

Hereinafter, a method of manufacturing a micro LED display with the second defective micro LEDs 31P-2 in the second display module 30-2 will be described in detail with reference to FIGS. 6A and 7B.

Figure 6A:
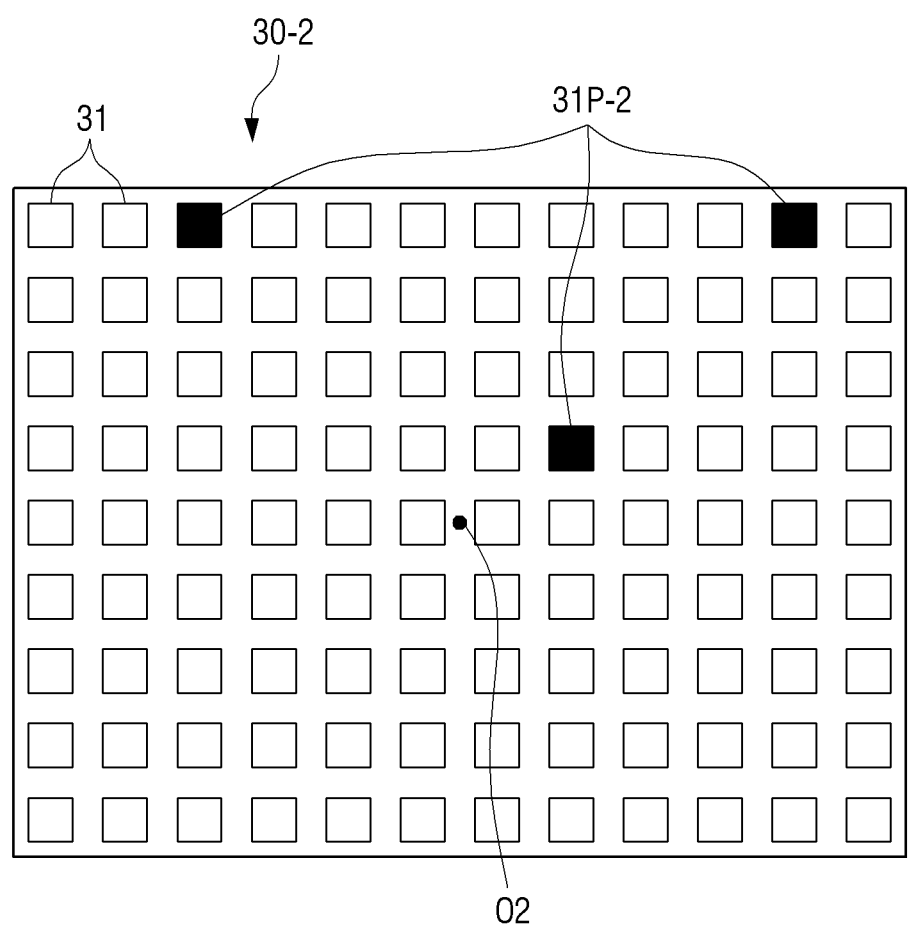
FIG. 6A is a top view illustrating a second display module according to an embodiment.
Figure 6B:
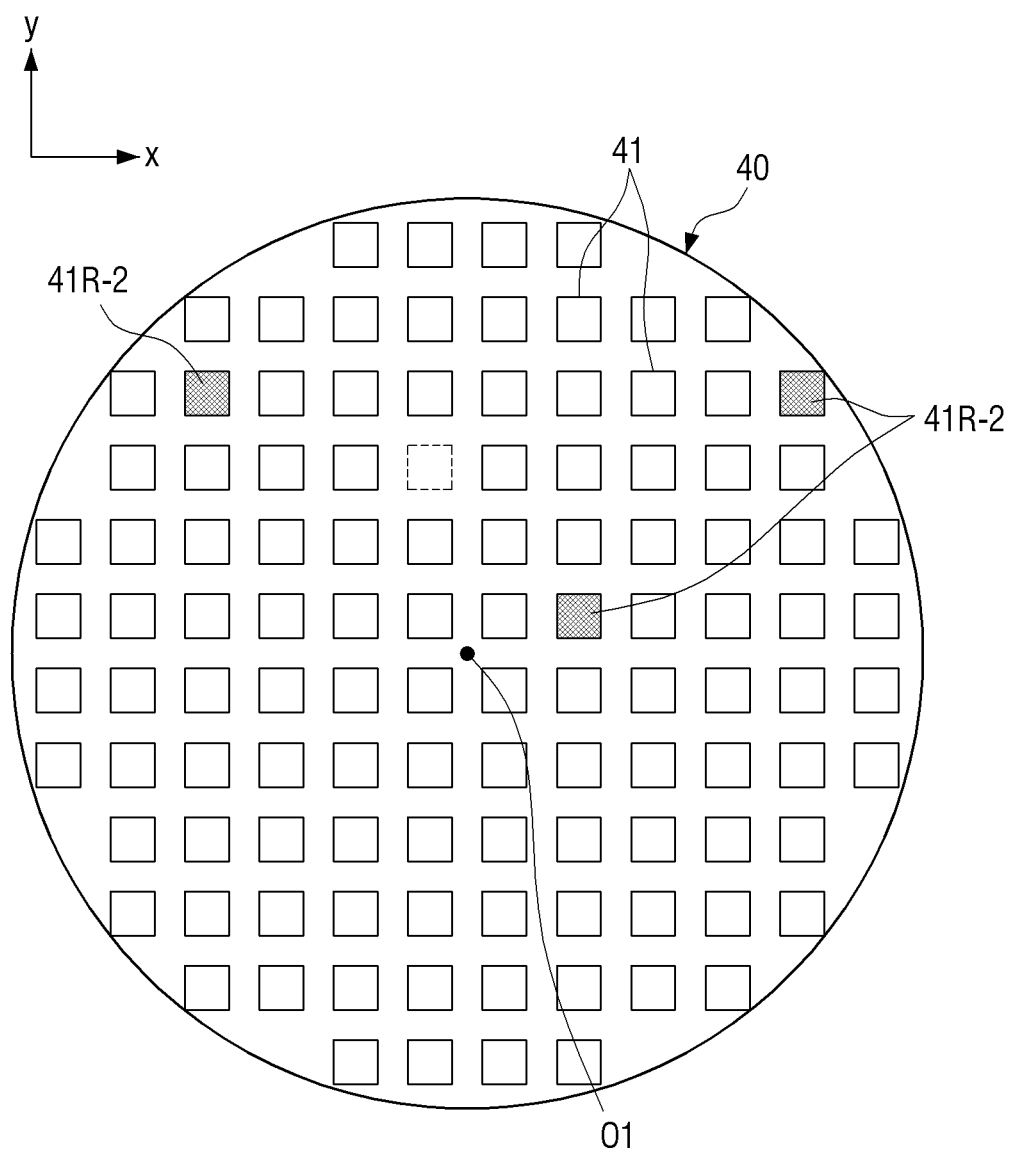
FIG. 6B is a bottom view illustrating a second substrate according to an embodiment.
Figure 7A:
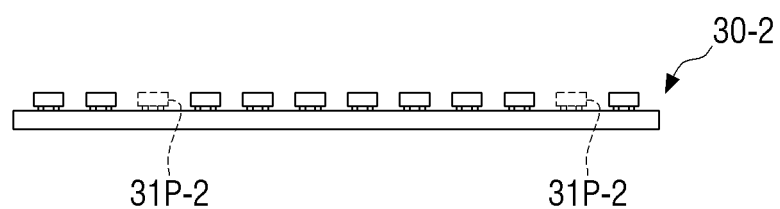
FIG. 7A is a schematic diagram illustrating a process of removing a plurality of second defective micro LEDs from the second display module according to an embodiment.

FIG. 6A is a top view illustrating the second display module 30-2 according to an embodiment; FIG. 6B is a bottom view illustrating the second substrate 40 according to an embodiment; FIG. 7A is a schematic diagram illustrating a process of removing the plurality of second defective micro LEDs 31P-2 from the second display module 30-2 according to an embodiment; and FIG. 7B is a schematic diagram illustrating a process of transferring a plurality of second repairing micro LEDs 41R-2 according to an embodiment.

First, the processor 60 may identify arrangement positions of the plurality of second defective micro LEDs 31P-2 with the inspection member.

The processor 60 may transmit information on the identified arrangement positions to the memory 70 and select the plurality of second repairing micro LEDs 41R-2 to replace the plurality of second defective micro LEDs 31P-2.

Specifically, the processor 60 may select the plurality of second repairing micro LEDs 41R-2 on the second substrate 40 based on distances between the plurality of second repairing micro LEDs 41R-2 and the plurality of second defective micro LEDs 31P-2 on the second display module 31-2.

That is, in case that the first substrate 30 includes a plurality of defective micro LEDs 31P, the processor 60 may select a plurality of repairing micro LEDs 41R based on their respective distances to the plurality of defective micro LEDs 31P.

Similarly, in case that the number of defective micro LEDs 31P is plural, the processor 60 may select a plurality of repairing micro LEDs 41R among the plurality of second micro LEDs 41 on the second substrate 40 based on their respective distances to the plurality of defective micro LEDs 31P.

For example, as illustrated in FIG. 6A, the processor 60 may identify the arrangement positions of the plurality of second defective micro LEDs 31P-2 and select virtual repairing micro LEDs on the second substrate 40.

The processor 60 may then select, as the plurality of second repairing micro LEDs 41R-2, virtual micro LEDs that are closest to the arrangement positions of the plurality of second defective micro LEDs 31P-2.

For example, referring to FIG. 6B, among the plurality of second micro LEDs 41, micro LEDs that are arranged at positions corresponding to the arrangement positions of the plurality of second defective micro LEDs 31P-2 may be selected as the plurality of second repairing micro LEDs 41R-2.

That is, the processor 60 may select, as the repairing micro LED 41R, a micro LED that is closest to the defective micro LED 31P, among the plurality of second micro LEDs 41 on the second substrate 40.

Here, the processor 60 may select the plurality of second repairing micro LEDs 41R-2 so that the plurality of second repairing micro LEDs 41R-2 do not overlap with the first repairing micro LED 41R-1 used to repair the first display module 30-1.

That is, the processor 60 may use all of the plurality of second micro LEDs 41 arranged on the second substrate 40 for the repair process, because the repairing micro LEDs used for the plurality of display modules do not overlap with each other.

As a result, all of the plurality of second micro LEDs 41 on the second substrate 40 may be exhaustively used, thereby reducing repair costs.

Furthermore, the processor 60 may select a laser transfer method for the plurality of second repairing micro LEDs 41R-2 based on the arrangement positions of the plurality of second defective micro LEDs 31P-2.

Specifically, the processor 60 may determine that the plurality of second repairing micro LEDs 41R-2 are dispersed in case that a sum of distances between the plurality of second defective micro LEDs 31P-2 is larger than a predetermined value.

As such, the processor 60 may selectively and sequentially transfer the plurality of selected second repairing micro LEDs 41R-2 by using a galvano type laser transfer method.

Figure 9A:
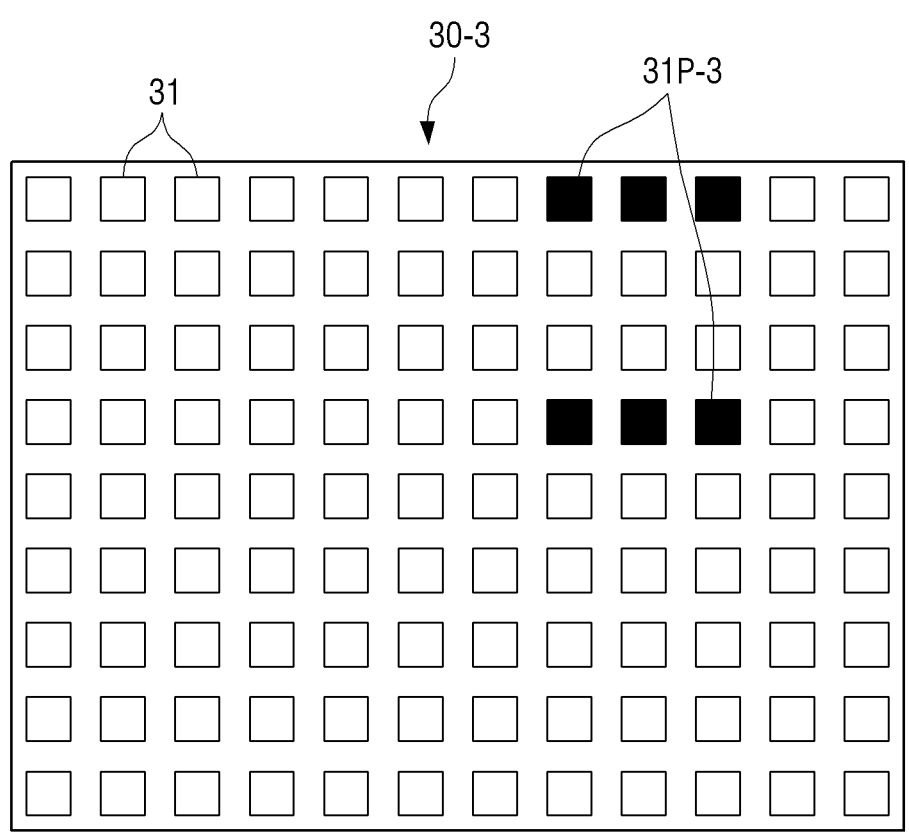
FIG. 9A is a top view illustrating a third display module according to an embodiment.

For example, the processor 60 may determine that the plurality of third defective micro LEDs 31P-3 are clustered when a sum of distances between the plurality of third defective micro LEDs 31P-3 is larger than the predetermined value as illustrated in FIG. 9A.

Here, the processor 60 may transfer a plurality of selected third repairing micro LEDs 41R-3 as one consecutive line by using a raster type laser transfer method.

Accordingly, the processor 60 may select the laser transfer method based on the distances between the plurality of defective micro LEDs 31P.

Figure 11A:
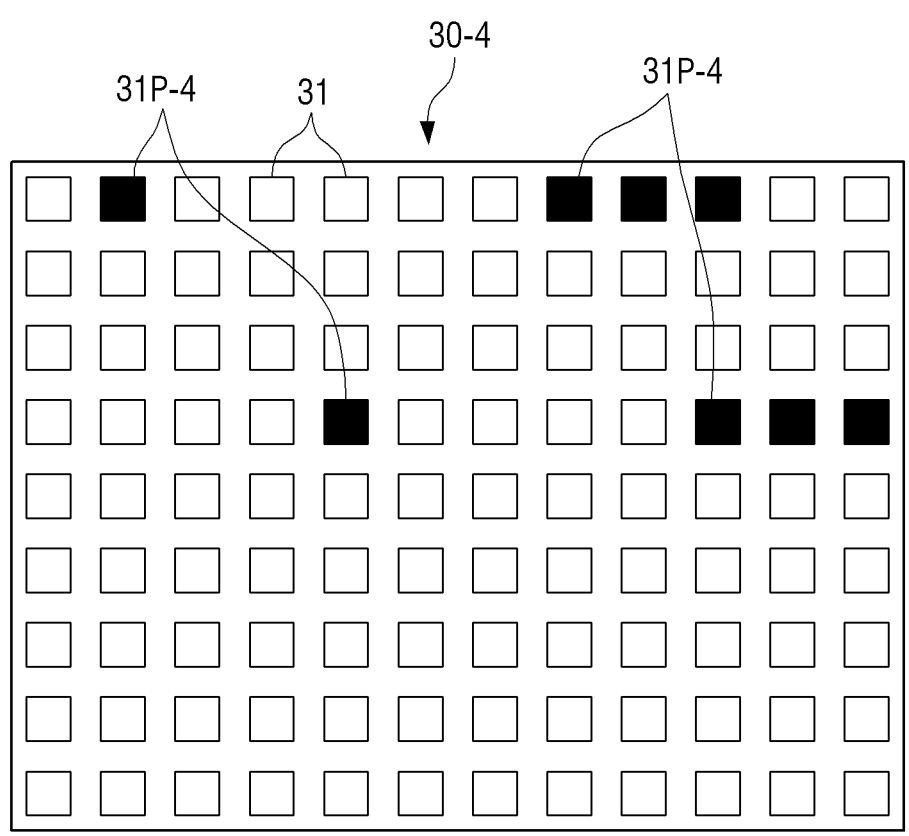
FIG. 11A is a top view illustrating a fourth display module according to an embodiment.
Figure 11B:
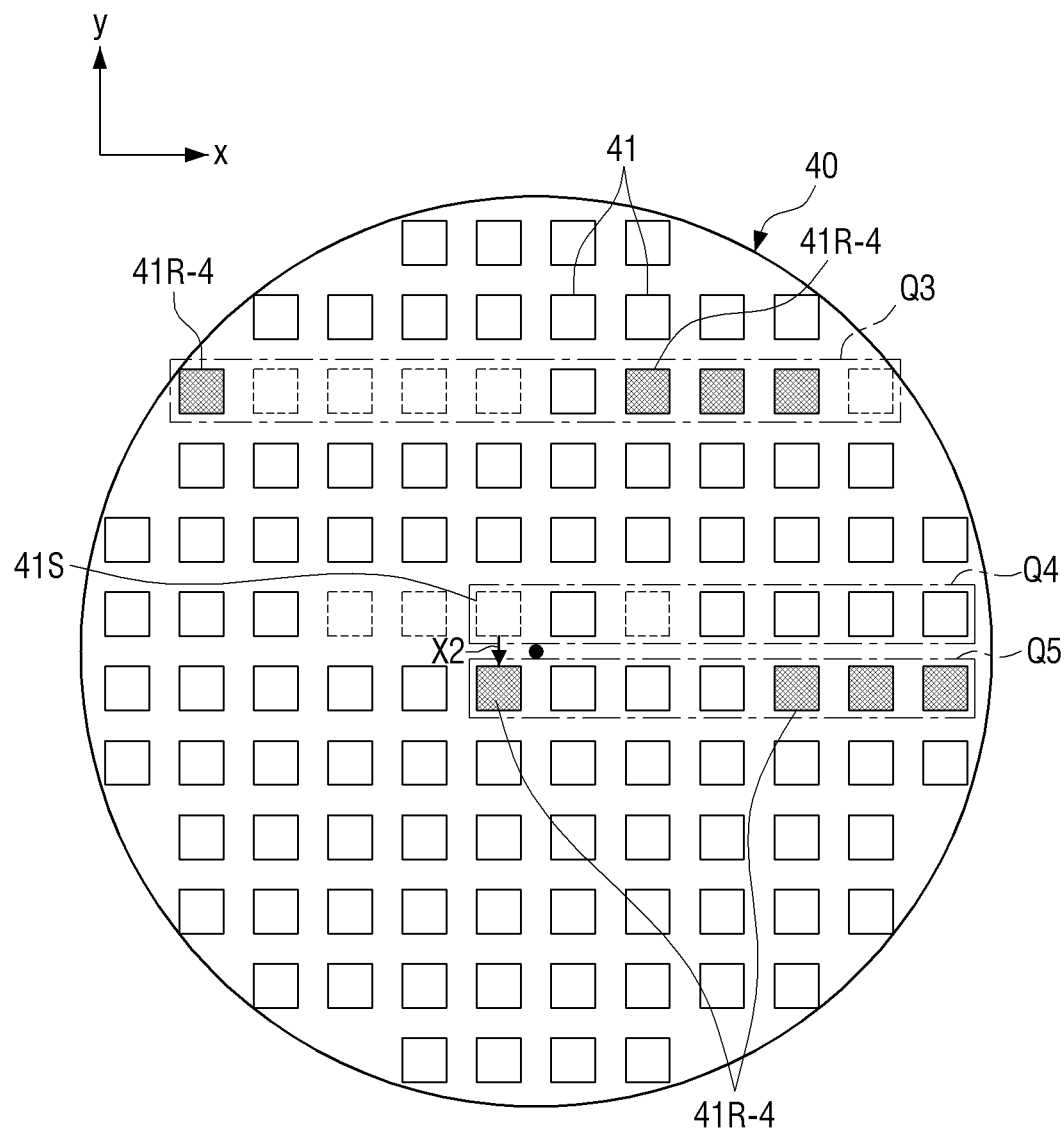
FIG. 11B is a bottom view illustrating a second substrate according to an embodiment.

Further, when a plurality of fourth defective micro LEDs 31P-4 are dispersed and clustered as illustrated in FIG. 11B, the galvano type laser transfer method may be used for the fourth defective micro LEDs 31P-4 that are dispersed, and the raster type laser transfer method may be used for the fourth defective micro LEDs 31P-4 that are clustered.

That is, the processor 60 may select the laser transfer method capable of significantly reducing a transfer time, based on distribution of the plurality of defective micro LEDs 31P.

Referring to FIG. 7A, the plurality of second defective micro LEDs 31P-2 on the first substrate 30 may be removed by an extraction member.

Figure 7B:
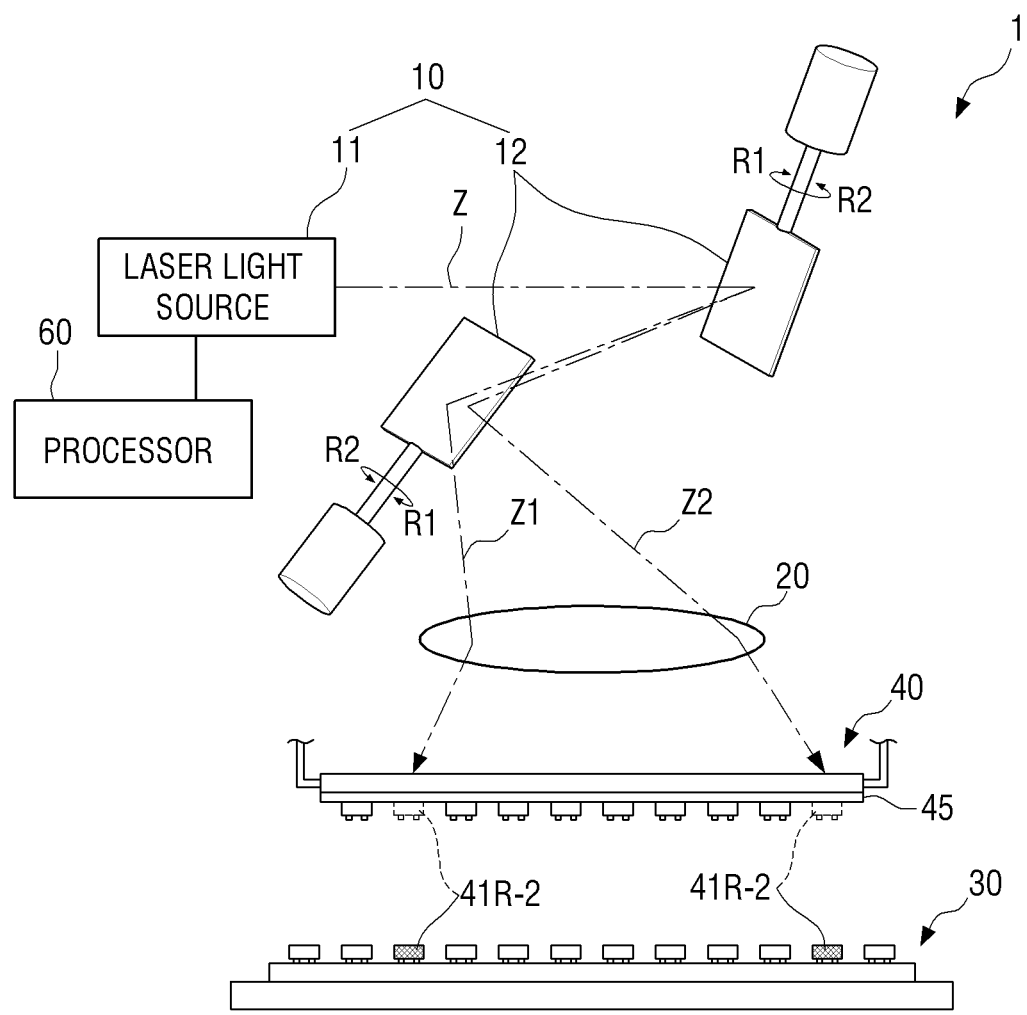
FIG. 7B is a schematic diagram illustrating a process of transferring a plurality of second repairing micro LEDs according to an embodiment.

Then, as illustrated in FIG. 7B, the processor 60 may control the moving member 50 to arrange (align) and transfer the plurality of second repairing micro LEDs 41R-2 to positions at which the plurality of second defective micro LEDs 31P-2 are removed.

Here, in case that the first substrate 30 includes a plurality of defective micro LEDs 31P, a plurality of selected repairing micro LEDs 41R corresponding to the plurality of defective micro LEDs 31P, respectively, may be sequentially transferred by using the laser transfer method.

Further, in case that the plurality of selected second repairing micro LEDs 41R-2 are arranged at the positions from which the plurality of second defective micro LEDs 31P-2 are removed, the processor 60 may control the moving member 50 to move at least one of the first substrate 30 or the second substrate 40 to arrange the plurality of second repairing micro LEDs 41R-2.

The processor 60 may control the laser device 10 to irradiate the laser Z onto the plurality of arranged second repairing micro LEDs 41R-2.

Here, the path of the laser Z may be changed by the path change member 12, such that a first laser Z1 and a second laser Z2 take different paths to be irradiated onto the second substrate 40.

Here, the first laser Z1 and the second laser Z2 may be irradiated to different positions corresponding to the plurality of second repairing micro LEDs 41R-2, respectively.

Further, the paths of the first laser Z1 and the second laser Z2 may be changed in a unit of ms, ρs, or ns, and the plurality of second repairing micro LEDs 41R-2 may be rapidly lifted off from the second substrate 40 almost at the same time.

Hereinafter, a process in which the repairing micro LED 41R is arranged at a position from which the defective micro LED 31P is removed will be described with reference to FIGS. 8A to 8C.

Figure 8A:
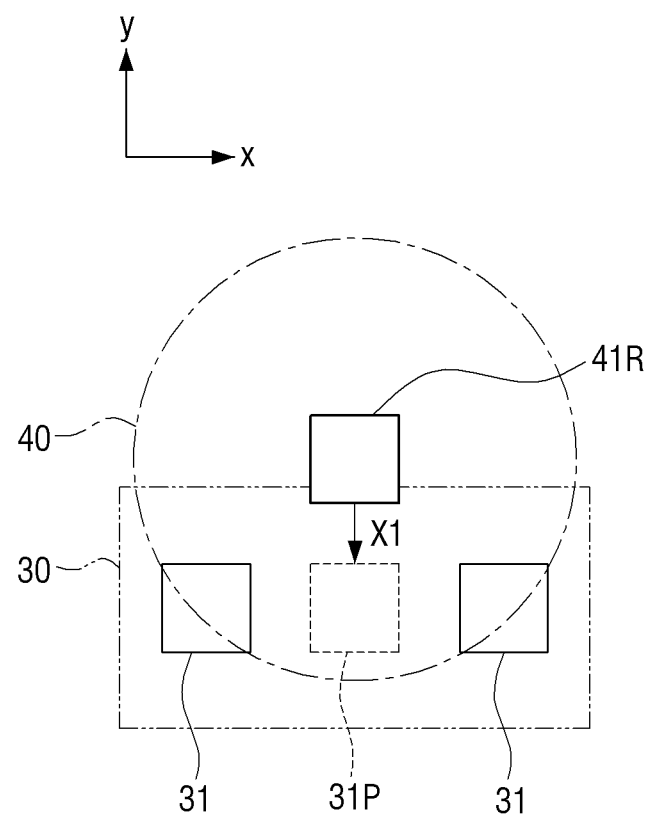
FIG. 8A is a schematic diagram illustrating a first state in which a repairing micro LED is not arranged at a position from which a defective micro LED is removed according to an embodiment.

FIG. 8A is a schematic diagram illustrating a first state in which the repairing micro LED 41R is not arranged at the position from which the defective micro LED 31P is removed according to an embodiment; FIG. 8B is a schematic diagram illustrating a second state in which the repairing micro LED 41R is not aligned with the position from which the defective micro LED 31P is removed according to an embodiment; and FIG. 8C is a schematic diagram illustrating a state in which the repairing micro LED 41R is aligned with the position from which the defective micro LED 31P is removed according to an embodiment.

Referring to FIG. 8A, the repairing micro LED 41R may be arranged at a position that does not align with the position at which the defective micro LED 31P is removed from the first substrate 30.

Accordingly, the processor 60 may control the moving member 50 to move the second substrate 40 in an X1 direction (that is, an X-axis direction) so that the repairing micro LED 41R may be arranged or align at the position from which the defective micro LED 31P is removed.

However, the second substrate 40 may not necessarily move in the X-axis direction, but may move only in a Y-axis direction. Alternatively, the first substrate 30 may move.

Figure 8B:
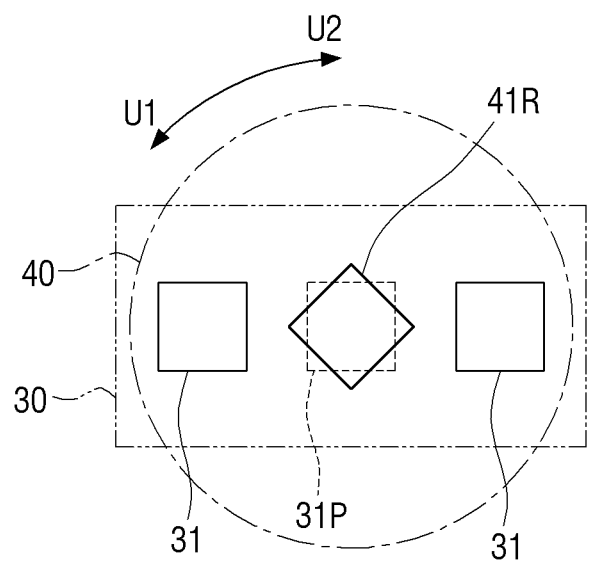
FIG. 8B is a schematic diagram illustrating a second state in which a repairing micro LED is not aligned with a position from which a defective micro LED is removed according to an embodiment.

Further, referring to FIG. 8B, the repairing micro LED 41R may be misaligned with the position at which the defective micro LED 31P is removed from the first substrate 30.

Accordingly, the processor 60 may control the moving member 50 to rotate the second substrate 40 in the U1 direction or U2 direction so that the repairing micro LED 41R may be aligned with the position at which the defective micro LED 31P is removed.

Figure 8C:
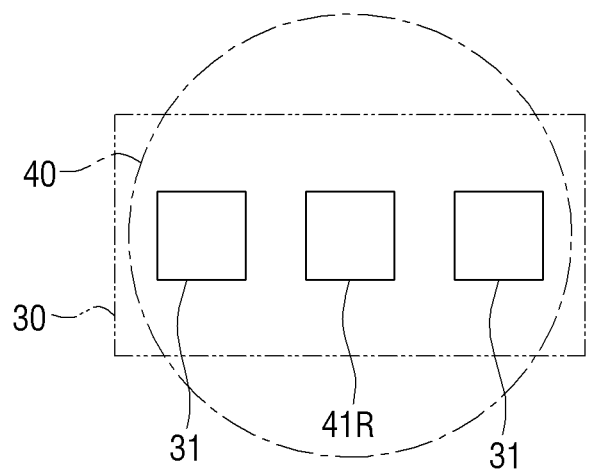
FIG. 8C is a schematic diagram illustrating a state in which a repairing micro LED is aligned with a position from which a defective micro LED is removed according to an embodiment.

As such, as illustrated in FIG. 8C, the repairing micro LED 41R may be aligned with the position at which the defective micro LED 31P is removed from the first substrate 30, and then the transfer may be performed.

However, the second substrate 40 may not necessarily rotate, but instead, the first substrate 30 may rotate as needed.

Here, aligning the repairing micro LED 41R with the position from which the defective micro LED 31P is removed may mean aligning the repairing micro LED 41R with the first micro LED 31 arranged around the arrangement position of the defective micro LED 31P.

Hereinafter, a method of manufacturing a micro LED display with the third defective micro LEDs 31P-3 arranged on the third display module 30-3 will be described in detail with reference to FIGS. 9A and 9B.

Figure 9B:
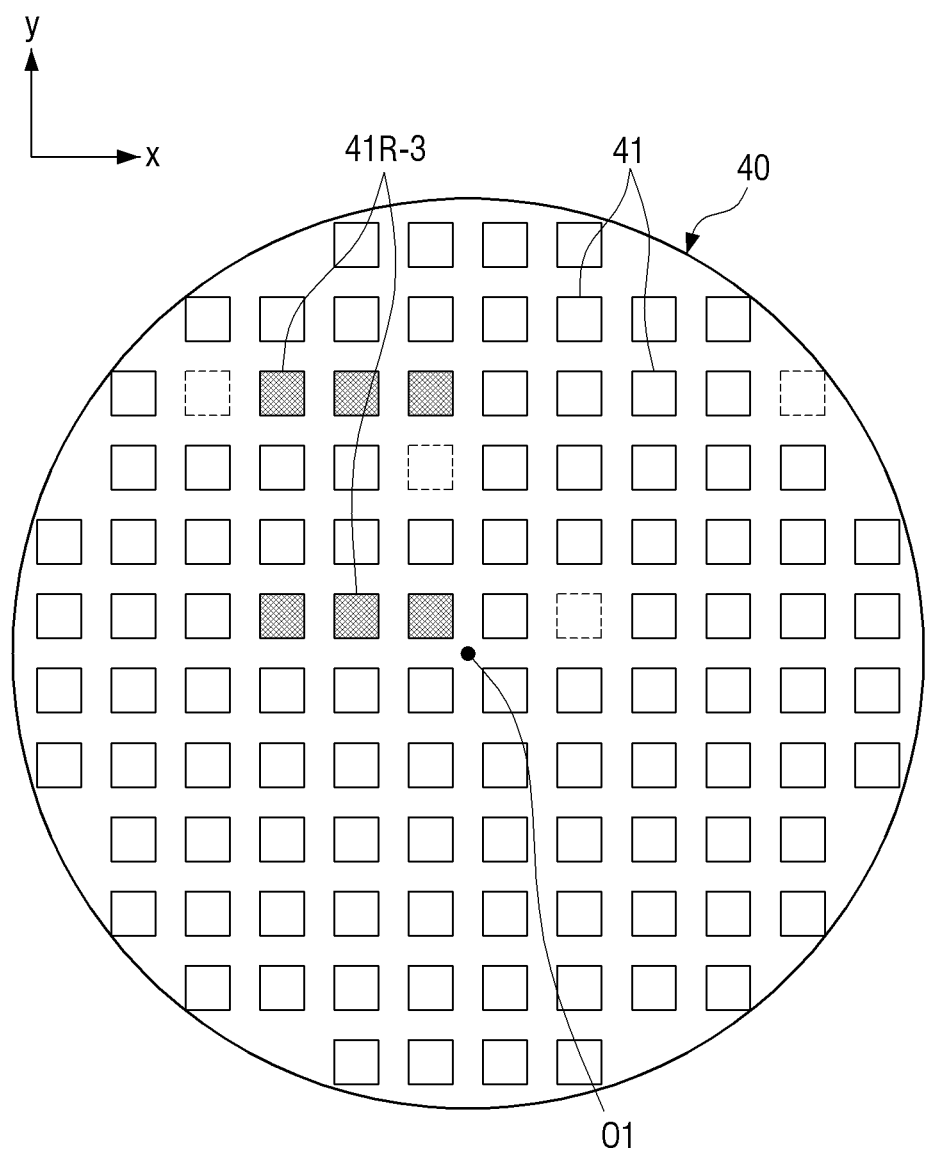
FIG. 9B is a bottom view illustrating a second substrate according to an embodiment.

FIG. 9A is a top view illustrating the third display module 30-3 according to an embodiment, and FIG. 9B is a bottom view illustrating the second substrate 40 according to an embodiment.

Here, the processor 60 may identify arrangement positions of the plurality of third defective micro LEDs 31P-3 through the inspection member.

Based on the identified arrangement positions, the processor 60 may transmit information on the identified arrangement positions to the memory 70 and select the plurality of third repairing micro LEDs 41R-3 to replace the plurality of third defective micro LEDs 31P-3.

Specifically, the processor 60 may select the plurality of third repairing micro LEDs 41R-3 on the second substrate 40 corresponding to the arrangement positions of the plurality of third defective micro LEDs 31P-3 on the first substrate 30, respectively.

That is, in case that the first substrate 30 includes a plurality of defective micro LEDs 31P, the processor 60 may select a plurality of repairing micro LEDs 41R on the second substrate 40 corresponding to arrangement positions of the plurality of defective micro LEDs 31P, respectively.

As such, the transfer may be performed immediately without moving the second substrate 40, because the plurality of third repairing micro LEDs 41R-3 on the second substrate 40 correspond to the arrangement positions of the plurality of third defective micro LEDs 31P-3, respectively. As a result, it is possible to greatly reduce time consumption for the repair process.

Hereinafter, a method of manufacturing a micro LED display with third defective micro LEDs 31P-3 arranged on a third display module 30-3 according to a modified embodiment will be described in detail with reference to FIGS. 10A and 10B.

Figure 10A:
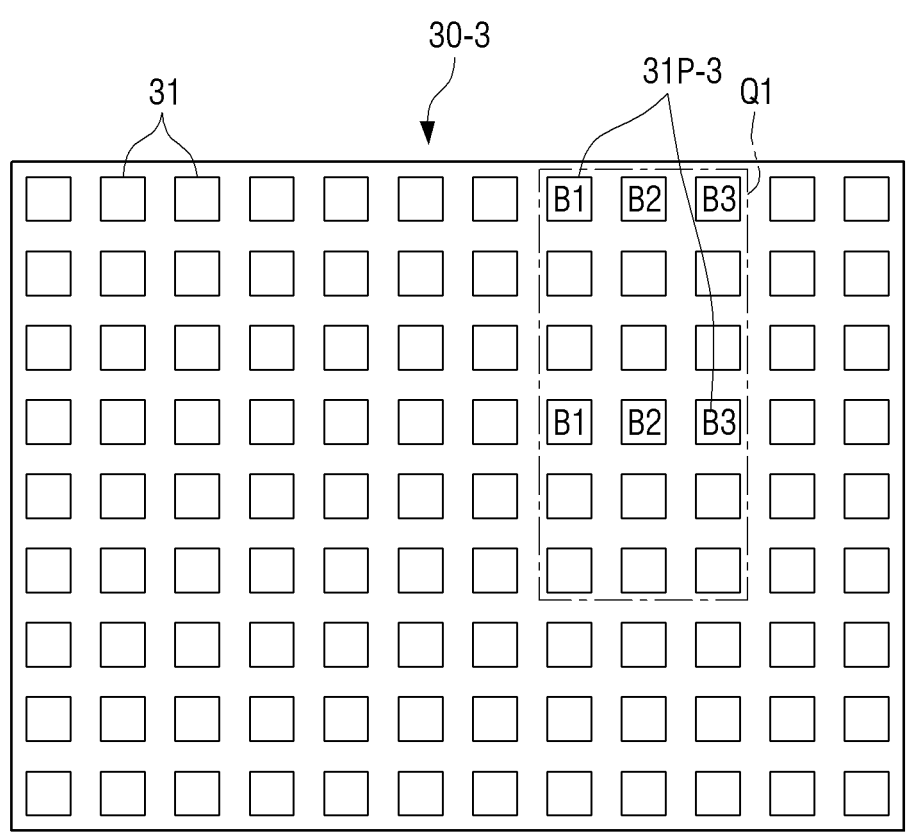
FIG. 10A is a top view illustrating a third display module according to an embodiment.
Figure 10B:
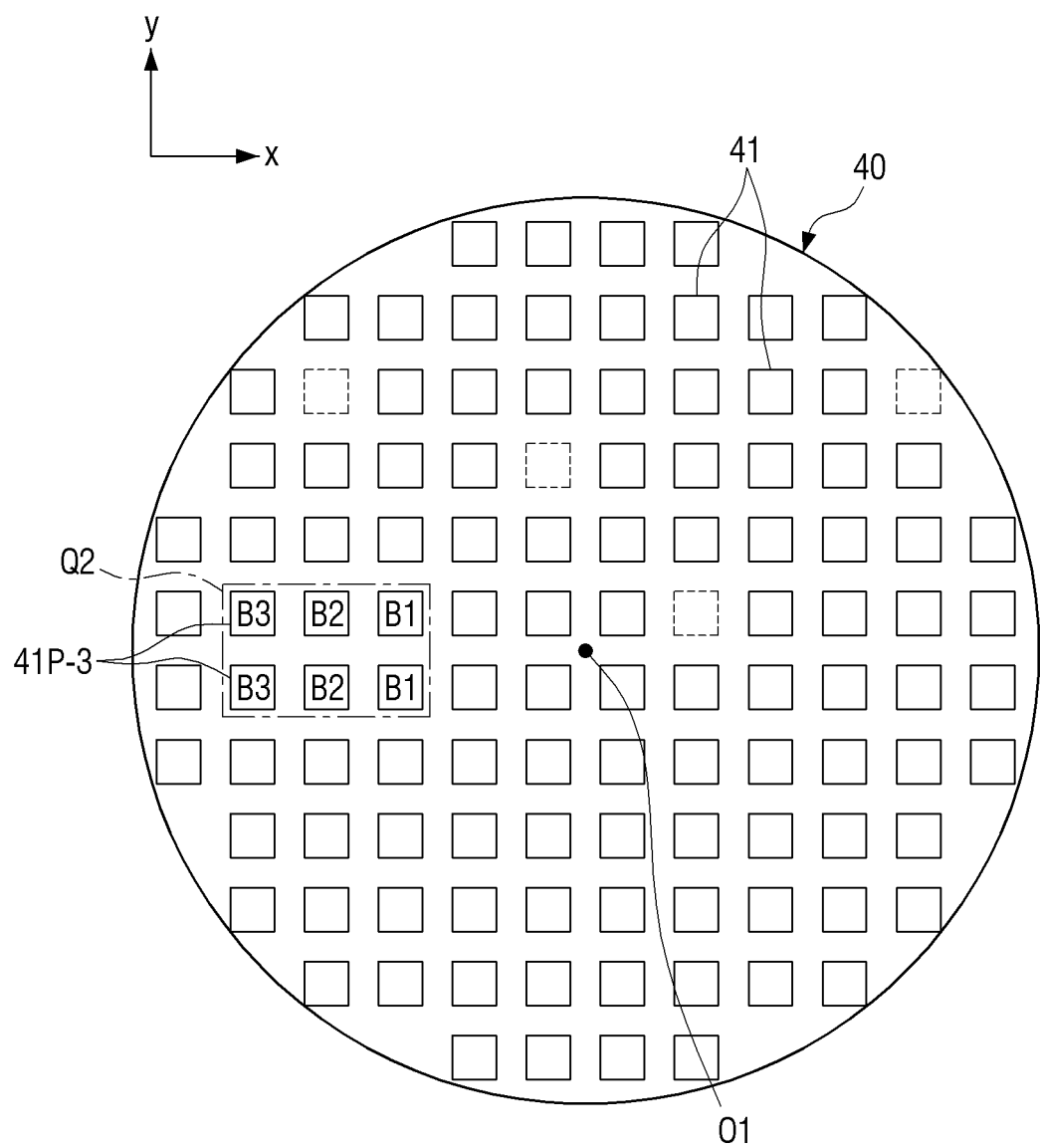
FIG. 10B is a bottom view illustrating a second substrate according to an embodiment.

FIG. 10A is a top view illustrating a third display module 30-3 according to a modified embodiment, and FIG. 10B is a bottom view illustrating a second substrate 40 according to a modified embodiment.

Here, the modified embodiment and the above-described embodiment may be different with respect to a process of selecting a repairing micro LED 41R, but may be similar in terms of the structure. Therefore, the same components will be denoted by the same reference numerals, and an overlapping description thereof will be omitted.

According to this modified embodiment, the processor 60 may select the plurality of third repairing micro LEDs 41R-3, not only based on a moving distance of the second substrate 40 to align a plurality of third defective micro LEDs 31P-3 and the plurality of third repairing micro LEDs 41R-3 with each other, but also based on characteristic information of the plurality of third defective micro LEDs 31P-3.

That is, the processor 60 may select a repairing micro LED 41R corresponding to the characteristic information of the defective micro LED 31P, among a plurality of second micro LEDs 41, based on the characteristic information of the defective micro LED 31P.

Here, the characteristic information may be a value obtained by measuring an output wavelength or a luminance of each of the plurality of micro LEDs, or at least one of an input output wavelength, an input luminance, or an input performance grade.

For example, the processor 60 may select the plurality of third repairing micro LED 41R-3 corresponding to the characteristic information of the plurality of third defective micro LEDs 31P-3 among the plurality of second micro LEDs 41 arranged on the second substrate 40.

For example, when the plurality of third defective micro LEDs 31P-3 include micro LEDs having grades of B1 to B3 according to the characteristic information of the plurality of third defective micro LEDs 31P-3, the processor 60 may select a plurality of third repairing micro LEDs 41R-3 including micro LEDs having grades of B1 to B3 among the plurality of second micro LEDs 41 arranged on the second substrate 40.

That is, the processor 60 may select, as the repairing micro LED 41R, a micro LED that is closest to the defective micro LED 31P in terms of characteristics, among micro LEDs 31 arranged on the second substrate 40.

Therefore, even when the third defective micro LEDs 31P-3 are replaced through the repair process, the third defective micro LEDs 31P-3 may be replaced with the third repairing micro LEDs 41R-3 having the same characteristic information, and thus it is possible to significantly reduce a difference in luminance and color of the display module before and after the repair process.

Further, the processor 60 may not necessarily select the third repairing micro LEDs 41R-3 based on each repairing micro LED having characteristic information corresponding to the characteristic information of each of the plurality of third defective micro LEDs 31P-3. The processor 60 may also select the third repairing micro LEDs 41R-3 by using average characteristic information of the plurality of third defective micro LEDs 31P-3.

For example, referring to FIGS. 10A and 10B, the processor 60 may select a Q2 region having average characteristic information corresponding to average characteristic information of a Q1 region including the plurality of third defective micro LEDs 31P-1 of the third display module 30-3, among the plurality of second micro LEDs 41 arranged on the second substrate 40.

As such, even when the plurality of second micro LEDs 41 having the same characteristic information as that of each of the plurality of third defective micro LEDs 31P-3 are not present on the second substrate 40, the processor 60 may select various combinations of third repairing micro LEDs 41R-3 by using average characteristic information.

Furthermore, in case that a plurality of repairing micro LEDs 41R are selected, the processor 60 may sequentially scan an upper surface of the second substrate 40 on which the plurality of repairing micro LEDs 41R are arranged with a laser to sequentially transfer the plurality of repairing micro LEDs 41R to the first substrate 30.

As a result, all of the plurality of second micro LEDs 41 on the second substrate 40 may be exhaustively used in the repair process even when the plurality of second micro LEDs 41 have different characteristic information, thereby reducing repair costs.

Hereinafter, a method of manufacturing a micro LED display with the fourth defective micro LEDs 31P-4 arranged on the fourth display module 30-4 will be described in detail with reference to FIGS. 11A and 11B.

FIG. 11A is a top view illustrating the fourth display module 30-4 according to an embodiment, and FIG. 11B is a bottom view illustrating the second substrate 40 according to an embodiment.

Here, the processor 60 may identify arrangement positions of the plurality of fourth defective micro LEDs 31P-4 through the inspection member.

Based on the identified arrangement positions, the processor 60 may transmit information on the identified arrangement positions to the memory 70 and select the plurality of fourth repairing micro LEDs 41R-4 to replace the plurality of fourth defective micro LEDs 31P-4.

Specifically, the processor 60 may select the plurality of fourth repairing micro LEDs 41R-4 in consideration of a moving distance for arranging the plurality of fourth repairing micro LEDs 41R-4 above the plurality of fourth defective micro LEDs 31P-4, respectively.

That is, the processor 60 may select a plurality of repairing micro LEDs 41R based on a moving distance for arranging the plurality of repairing micro LEDs 41R above a plurality of defective micro LEDs 31P, respectively.

For example, in case that the number of the plurality of second micro LEDs 41 arranged on the second substrate 40 is decreased due to the repeatedly performed repair process, there may be no micro LED at a position corresponding to the plurality of fourth defective micro LEDs 31P-4 in the plurality of second micro LEDs 41 of the second substrate 40.

Specifically, referring to FIG. 11B, the processor 60 may select a plurality of virtual repairing micro LEDs, but a Q4 region spaced apart from the Q3 region may include second micro LEDs 41S which are empty spaces due to used up repairing micro LEDs in the previous repair processes.

Accordingly, the processor 60 may select a Q5 region adjacent to the Q4 region to minimize a moving distance of the second substrate 40.

As a result, the processor 60 may select a plurality of fourth repairing micro LEDs 41R-4 included in the Q3 region and the Q5 region.

Thereafter, the arrangement and transfer of the plurality of fourth repairing micro LEDs 41R-4 may be alternately performed for the plurality of defective micro LEDs 31P, respectively, even in a process of transferring the plurality of fourth repairing micro LEDs 41R-4 to the first substrate 30.

For example, after the fourth repairing micro LEDs 41R-4 included in the Q3 region are primarily transferred, the second substrate 40 moves in an X2 direction. Next, the fourth repairing micro LEDs 41R-4 included in the Q5 region may be secondarily transferred.

By doing so, the moving distance of the second substrate 40 is significantly decreased, and thus the speed of the repair process may be increased. In addition, the repair costs may also be reduced, because all of the plurality of second micro LEDs 41 of the second substrate 40 may be used.

Hereinafter, a method of manufacturing a micro LED display will be described in detail with reference to FIG. 12.

Figure 12:
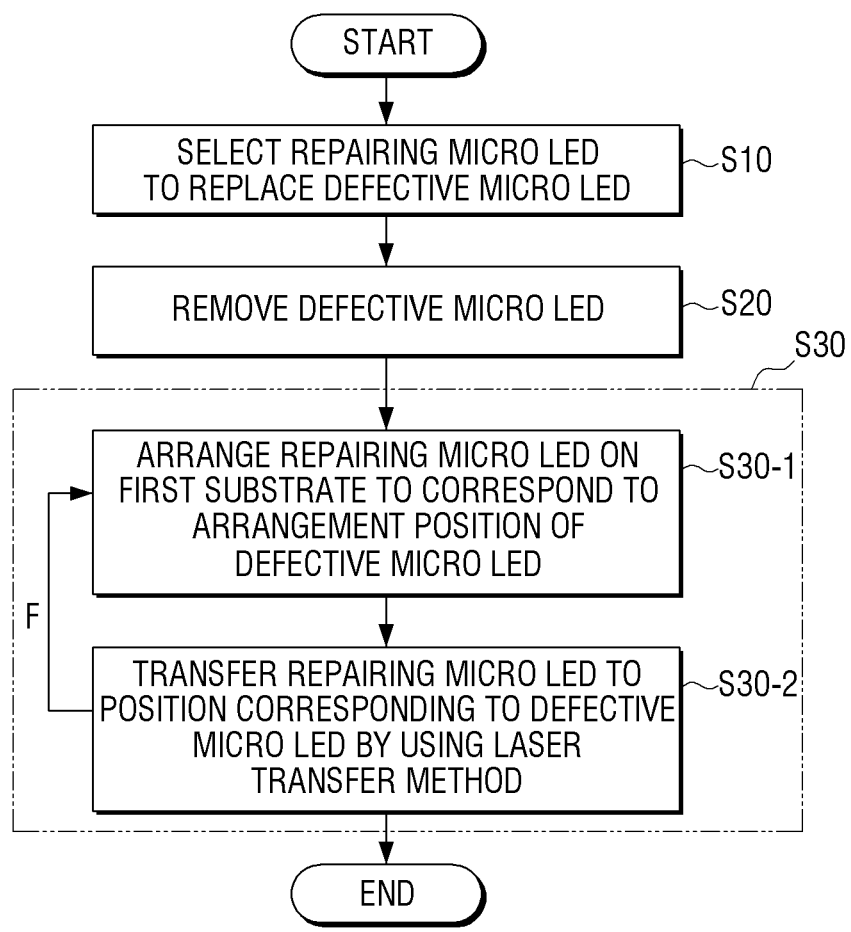
FIG. 12 is a flowchart illustrating a method of manufacturing a micro LED display according to an embodiment.

FIG. 12 is a flowchart illustrating a method of manufacturing a micro LED display according to an embodiment.

In operation S10, a repairing micro LED 41R to replace a defective micro LED 31P may be selected. Specifically, the repairing micro LED 41R to replace the defective micro LED 31P may be selected among the plurality of second micro LEDs 41 arranged on the second substrate 40, in consideration of an arrangement position of the defective micro LED 31P on the first substrate 30 on which the plurality of first micro LEDs 31 are arranged.

Here, the selection may be simulated by specifying a virtual micro LED among the plurality of second micro LEDs 41 and considering various factors such as a distance between the virtual micro LED and the defective micro LED 31P, a distance by which the second substrate 40 is to move at the time of the transfer, a presence or absence of a corresponding LED, and characteristic information of the defective micro LED 31P.

Accordingly, the processor 60 may select the repairing micro LED 41R in consideration of various factors desired by the user.

In operation S20, the defective micro LED 31P may be removed from the first substrate 30.

In operation S30, the selected repairing micro LED 41R may be transferred to a position from which the defective micro LED 31P is removed on the first substrate 30.

Specifically, the repairing micro LED 41R may be arranged on the first substrate 30 to correspond to the arrangement position of the defective micro LED 31P (operation S30-1). Then, the repairing micro LED 41R may be transferred to the arrangement position of the defective micro LED 31P by the laser transfer method (operation S30-2).

Here, in case that the first substrate 30 includes a plurality of defective micro LEDs 31P, the operation of arranging (S30-1) and the operation of transferring (S30-2) may be repeatedly performed along a path F.

As such, the defective micro LED 31P may be removed and the repairing micro LED 41R may be transferred to a corresponding position through the repeatedly performed arrangement (alignment) and transfer process, thereby performing the repair process.

The methods according to the various embodiments of the disclosure described above may be implemented in a form of an application that may be installed in the existing electronic apparatus.

Further, the methods according to the various embodiments of the disclosure described above may be implemented only by performing a software upgrade or a hardware upgrade with respect to the existing electronic apparatus.

Further, the various embodiments of the disclosure described above may be implemented through an embedded server provided in the electronic apparatus, or an external server of the electronic apparatus.

Furthermore, the various embodiments of the disclosure described above may be implemented in a computer or a computer readable recording medium using software, hardware, or a combination of software and hardware. In some cases, the embodiments described in the disclosure may be implemented by the processor 60 itself. According to a software implementation, the embodiments such as procedures and functions described in the disclosure may be implemented by separate software modules. Each of the software modules may perform one or more functions and operations described in the disclosure.

Computer instructions for performing processing operations of the transfer apparatus 1 according to the various embodiments described above may be stored in a non-transitory computer-readable medium. The computer instructions stored in the non-transitory computer-readable medium may allow a specific device to perform the processing operations of the transfer apparatus 1 according to the various embodiments described above when they are executed by a processor of the specific device.

The non-transitory computer-readable medium may not be a medium that stores data therein for a while, such as a register, a cache, a memory, or the like, but means a medium that semi-permanently stores data therein and is readable by the machine. A specific example of the non-transitory computer-readable medium may include a compact disc (CD), a digital versatile disc (DVD), a hard disk, a Blu-ray disk, a universal serial bus (USB), a memory card, or a ROM.

Although the various embodiments of the disclosure have been individually described hereinabove, the embodiments may not necessarily be implemented individually, but may also be implemented so that configurations and operations of one or more other embodiments may be combined.

Although embodiments of the disclosure have been illustrated and described hereinabove, the disclosure is not limited to the abovementioned specific embodiments, but may be variously modified by those skilled in the art to which the disclosure pertains without departing from the gist of the disclosure. These modifications should be understood to fall within the scope and spirit of the disclosure.

What is claimed is:

1. A method of manufacturing a micro light emitting diode (LED) display, the method comprising:
identifying a repairing micro LED, from among a plurality of second micro LEDs, on a second substrate based on a first position of a defective micro LED, from among a plurality of first micro LEDs, on a first substrate;
removing the defective micro LED from the first substrate;
matching the first position on the first substrate from which the defective micro LED has been removed to a second position of the repairing micro LED on the second substrate; and
transferring the repairing micro LED from the second position on the second substrate to the first position on the first substrate from which the defective micro LED has been removed, by using a laser transfer method,
wherein the matching comprises moving at least one of the first substrate or the second substrate to align the second position on the second substrate with the first position on the first substrate.

2. The method of claim 1, wherein the identifying the repairing micro LED comprises selecting a plurality of repairing micro LEDs, from among the plurality of second micro LEDs, on the second substrate based on a distance between a plurality of defective micro LEDs on the first substrate.

3. The method of claim 2, wherein the selecting the repairing micro LED further comprises identifying a second micro LED that is closest to the defective micro LED, from among the plurality of second micro LEDs, as the repairing micro LED.

4. The method of claim 2, wherein the identifying the repairing micro LED further comprises identifying the second micro LED that is closest to the defective micro LED, from among second micro LEDs having characteristic information corresponding to the defective micro LED, as the repairing micro LED.

5. The method of claim 2, wherein the transferring comprises sequentially scanning an upper surface of the second substrate on which the plurality of repairing micro LEDs are arranged to sequentially transfer the plurality of repairing micro LEDs to the first substrate.

6. The method of claim 1, wherein the first substrate is a target substrate mounted on the micro LED display,
wherein the second substrate is a transfer substrate for transferring a micro LED to the target substrate, and
wherein the matching comprises moving the second substrate with respect to the first substrate.

7. The method of claim 1, further comprising:
identifying the defective micro LED, from among the plurality of first micro LEDs, on the first substrate; and
storing information on the first position of the defective micro LED on the first substrate.

8. The method of claim 4, wherein the characteristic information is at least one of an output wavelength, a luminance, or a performance grade.

9. The method of claim 1, wherein the plurality of first micro LEDs include a red micro LED, a green micro LED, and a blue micro LED, and
wherein a color of light emitted by the repairing micro LED corresponds to a color of light emitted by the defective micro LED.

10. A transfer apparatus comprising:
a laser device;
a moving member configured to move at least one of a first substrate on which a plurality of first micro light emitting diodes (LEDs) are arranged or a second substrate on which a plurality of second micro LEDs are arranged;
an extraction member configured to remove a micro LED; and
a processor configured to:
identify a repairing micro LED, from among the plurality of second micro LEDs, based on a first position of a defective micro LED, from among the plurality of first micro LEDs, on the first substrate,
control the extraction member to remove the defective micro LED from the first substrate,
control the moving member to match the first position on the first substrate from which the defective micro LED has been removed to a second position of the repairing micro LED on the second substrate, and
control the laser device to transfer the repairing micro LED from the second position on the second substrate to the first position on the first substrate from which the defective micro LED has been removed,
wherein the processor is further configured to control the moving member to move at least one of the first substrate or the second substrate to align the second position on the second substrate with the first position on the first substrate.

11. The transfer apparatus of claim 10, wherein the processor is further configured to identify a plurality of repairing micro LEDs, from among the plurality of second micro LEDs, on the second substrate based on a distance between a plurality of defective micro LEDs on the first substrate.

12. The transfer apparatus of claim 11, wherein the processor is further configured to identify a second micro LED that is closest to the defective micro LED, from among the plurality of second micro LEDs, as the repairing micro LED.

13. The transfer apparatus of claim 11, wherein the processor is further configured to identify the second micro LED that is closest to the defective micro LED, from among second micro LEDs having characteristic information corresponding to the defective micro LED, as the repairing micro LED.

14. The transfer apparatus of claim 11, wherein the processor is further configured to control the laser device to sequentially scan an upper surface of the second substrate on which the plurality of repairing micro LEDs are arranged, with a laser to sequentially transfer the plurality of repairing micro LEDs to the first substrate.

15. The transfer apparatus of claim 10, wherein the first substrate is a target substrate mounted on the micro LED display,
wherein the second substrate is a transfer substrate for transferring a micro LED to the target substrate, and
wherein the processor is further configured to control the moving member to move the second substrate with respect to the first substrate.

16. The transfer apparatus of claim 13, wherein the characteristic information is at least one of an output wavelength, a luminance, or a performance grade.

17. The transfer apparatus of claim 10, wherein the plurality of first micro LEDs include a red micro LED, a green micro LED, and a blue micro LED, and
wherein a color of light emitted by the repairing micro LED corresponds to a color of light emitted by the defective micro LED.

18. A non-transitory computer readable recording medium storing a program including executable instructions, which when executed by a processor, cause the processor to perform a method of manufacturing a micro light emitting diode (LED) display, the method comprising:
identifying a repairing micro LED, from among a plurality of second micro LEDs, on a second substrate based on a first position of a defective micro LED, from among a plurality of first micro LEDs, on a first substrate;
removing the defective micro LED from the first substrate;
matching the first position on the first substrate from which the defective micro LED has been removed to a second position of the repairing micro LED on the second substrate; and
transferring the repairing micro LED from the second position on the second substrate to the first position on the first substrate from which the defective micro LED has been removed, by using a laser transfer method.

* * * * *